Nov. 26, 1968 L. P. HORWITZ ET AL 3,413,602

DATA CONVERSION TECHNIQUES FOR PRODUCING AUTOCORRELATION FUNCTIONS

Original Filed July 25, 1960 30 Sheets-Sheet 1

INVENTORS
LAWRENCE P. HORWITZ
GLENMORE L. SHELTON JR.

BY Francis J. Thomas
ATTORNEY

Nov. 26, 1968 L. P. HORWITZ ETAL 3,413,602

DATA CONVERSION TECHNIQUES FOR PRODUCING AUTOCORRELATION FUNCTIONS

Original Filed July 25, 1960 30 Sheets-Sheet 2

Nov. 26, 1968 L. P. HORWITZ ET AL 3,413,602
DATA CONVERSION TECHNIQUES FOR PRODUCING AUTOCORRELATION FUNCTIONS
Original Filed July 25, 1960 30 Sheets-Sheet 7
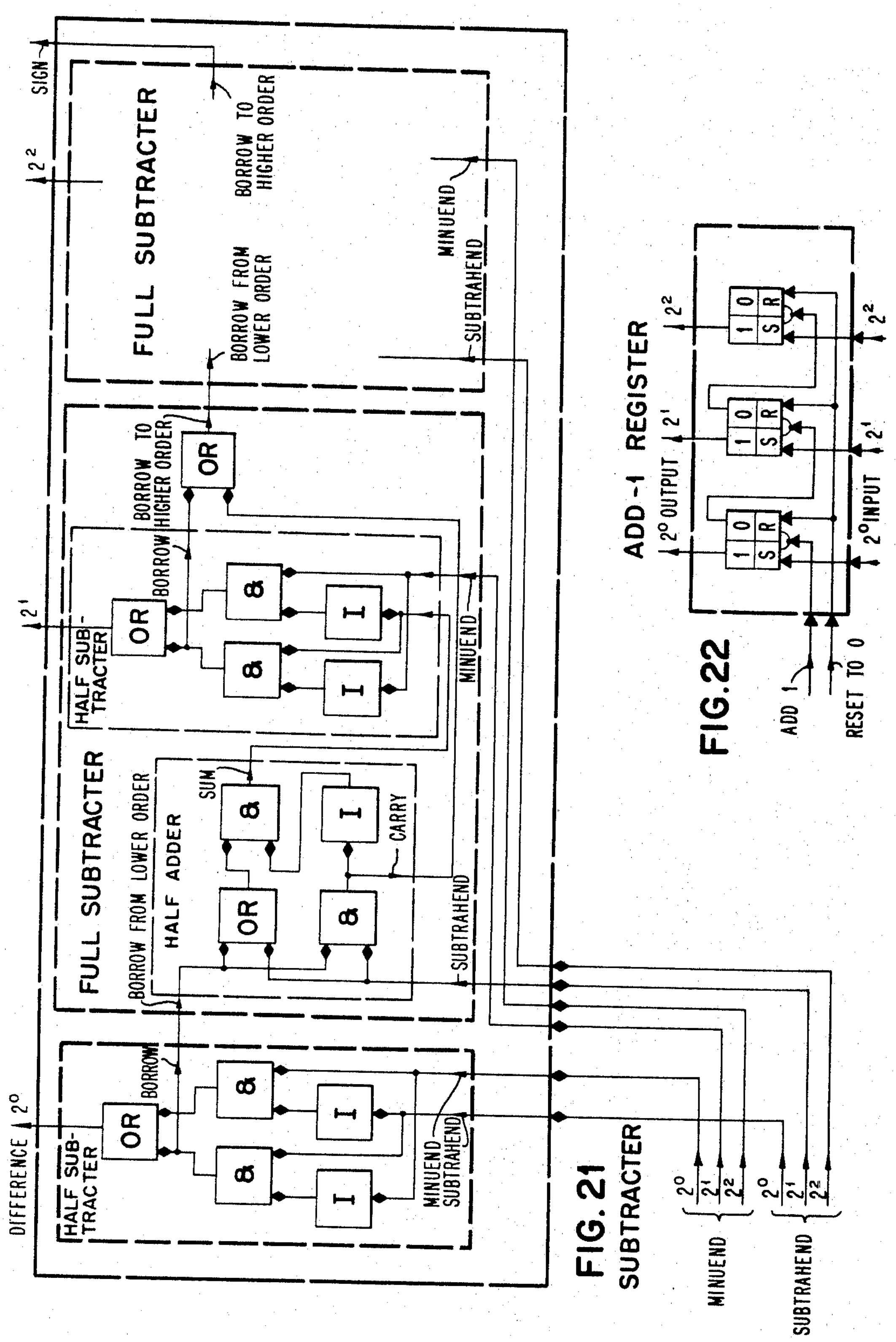
FIG. 21 SUBTRACTER, FIG. 22

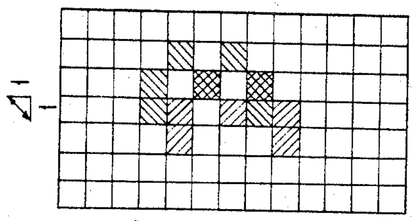
FIG. 29
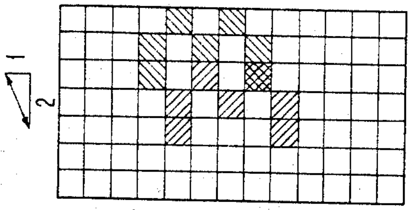
FIG. 28
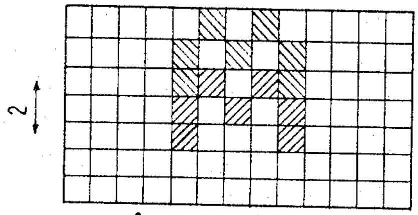
FIG. 27
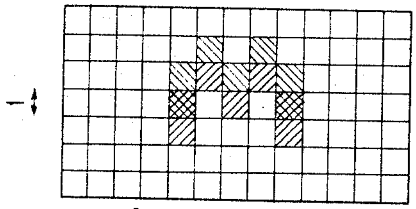
FIG. 26
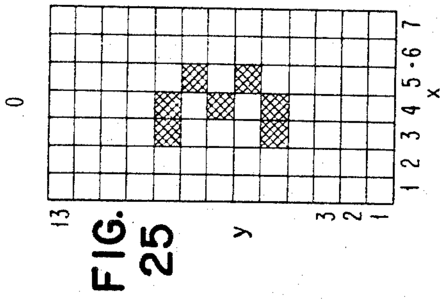
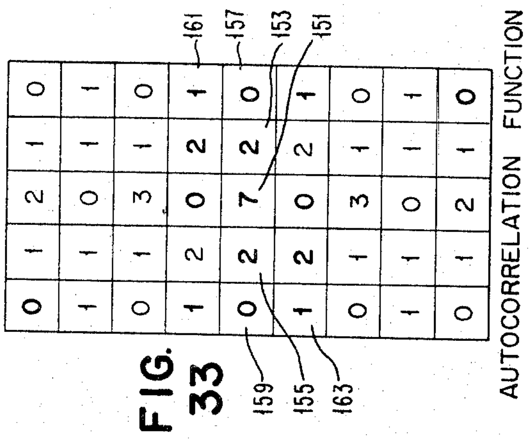
FIG. 33
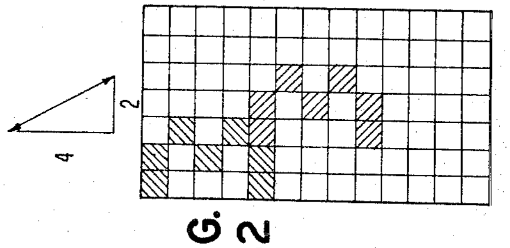
FIG. 32
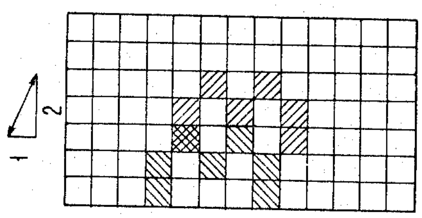
FIG. 31
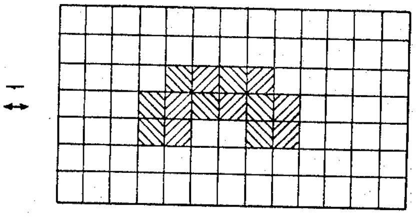
FIG. 30

Nov. 26, 1968 L. P. HORWITZ ETAL 3,413,602
DATA CONVERSION TECHNIQUES FOR PRODUCING
AUTOCORRELATION FUNCTIONS
Original Filed July 25, 1960 30 Sheets-Sheet 13
f(x,y)
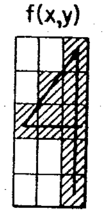
$D_R(x',y')$
| | | | | |
|---|---|---|---|---|
| | | 8 | 3 | 1 |
| 1 | 3 | 5 | 2 | 1 |
| 1 | 1 | 3 | 2 | 1 |
| 0 | 0 | 2 | 1 | 0 |
| 0 | 0 | 1 | 0 | 0 |
$Z_R(x',y')$
| | | | | |
|---|---|---|---|---|
| | | 0.5547 | 0.2080 | 0.0693 |
| 0.0693 | 0.2080 | 0.3467 | 0.1387 | 0.0693 |
| 0.0693 | 0.0693 | 0.2080 | 0.1387 | 0.0693 |
| 0 | 0 | 0.1387 | 0.0693 | 0 |
| 0 | 0 | 0.0693 | 0 | 0 |
$Y_R(x',y')$
| | | | | | | | | |
|---|---|---|---|---|---|---|---|---|
| | | | | 2.860 | -1.049 | 0 | -0.048 | 0.048 |
| 0.048 | -0.048 | -0.286 | 0.477 | -0.048 | -0.715 | 0.191 | -0.095 | 0.048 |
| 0.048 | -0.238 | 0.667 | -0.715 | 0.143 | 0.191 | 0.286 | -0.191 | 0.048 |
| 0 | 0.095 | -0.143 | -0.477 | 0.524 | 0 | -0.429 | 0.143 | 0 |
| 0 | 0 | -0.095 | -0.143 | 0.429 | -0.477 | 0.191 | 0 | 0 |
| 0 | 0 | 0 | 0.095 | -0.286 | 0.143 | 0 | 0 | 0 |
| 0 | 0 | 0 | 0 | 0.048 | 0 | 0 | 0 | 0 |
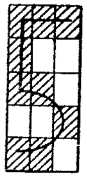
| | | | | |
|---|---|---|---|---|
| | | 9 | 4 | 1 |
| 2 | 2 | 2 | 2 | 1 |
| 1 | 3 | 4 | 2 | 1 |
| 0 | 0 | 2 | 2 | 1 |
| 1 | 2 | 2 | 1 | 0 |
| | | | | |
|---|---|---|---|---|
| | | 0.5704 | 0.2535 | 0.0634 |
| 0.1267 | 0.1267 | 0.1267 | 0.1267 | 0.0634 |
| 0.0634 | 0.1901 | 0.2535 | 0.1267 | 0.0634 |
| 0 | 0 | 0.1267 | 0.1267 | 0.0634 |
| 0.0634 | 0.1267 | 0.1267 | 0.0634 | 0 |
| | | | | | | | | |
|---|---|---|---|---|---|---|---|---|
| | | | | 3.165 | -0.259 | -0.489 | 0.058 | 0.029 |
| 0.058 | -0.288 | 0.719 | -0.403 | -1.813 | 0.115 | 0.144 | -0.058 | 0.029 |
| 0.029 | -0.029 | -0.288 | 0.691 | 0.949 | -0.345 | 0.029 | -0.058 | 0.029 |
| 0 | 0.115 | -0.058 | -1.036 | -0.144 | 0.230 | 0.144 | -0.115 | 0.029 |
| 0.029 | -0.173 | 0.201 | 0.691 | 0.259 | -0.058 | -0.259 | 0.086 | 0 |
| 0 | 0.058 | -0.115 | -0.288 | -0.230 | -0.058 | 0.086 | 0 | 0 |
| 0 | 0 | 0.029 | 0.058 | 0.058 | 0.029 | 0 | 0 | 0 |
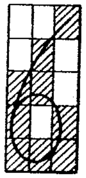
| | | | | |
|---|---|---|---|---|
| | | 9 | 3 | 2 |
| 1 | 4 | 4 | 2 | 2 |
| 1 | 3 | 2 | 3 | 1 |
| 1 | 1 | 2 | 1 | 0 |
| 1 | 1 | 1 | 0 | 0 |
| | | | | |
|---|---|---|---|---|
| | | 0.5614 | 0.1871 | 0.1248 |
| 0.0624 | 0.2495 | 0.2495 | 0.1248 | 0.1248 |
| 0.0624 | 0.1871 | 0.1248 | 0.1871 | 0.0624 |
| 0.0624 | 0.0624 | 0.1248 | 0.0624 | 0 |
| 0.0624 | 0.0624 | 0.0624 | 0 | 0 |
| | | | | | | | | |
|---|---|---|---|---|---|---|---|---|
| | | | | 3.330 | -1.498 | 0.499 | -0.233 | 0.067 |
| 0.033 | 0.067 | -0.566 | 0.832 | -0.766 | -0.633 | 0.566 | -0.266 | 0.067 |
| 0.033 | -0.033 | -0.166 | 0.633 | -0.932 | 1.132 | -0.333 | -0.033 | 0.033 |
| 0.033 | -0.100 | 0.233 | -0.699 | 0.633 | -0.300 | -0.200 | 0.100 | 0 |
| 0.033 | -0.166 | 0.266 | 0.166 | 0.100 | -0.266 | 0.133 | 0 | 0 |
| 0 | 0.067 | -0.166 | -0.100 | -0.133 | 0.100 | 0 | 0 | 0 |
| 0 | 0 | 0.033 | 0.033 | 0.033 | 0 | 0 | 0 | 0 |
FIG. 34b Nov. 26, 1968 L. P. HORWITZ ET AL 3,413,602

DATA CONVERSION TECHNIQUES FOR PRODUCING AUTOCORRELATION FUNCTIONS

Original Filed July 25, 1960 30 Sheets-Sheet 14

NORMALIZED COMPARISON

FIG. 35

| INPUT PATTERN | REFERENCE PATTERN 1 | 2 | 3 | 4 | 5 | 6 | 7 | 8 | 9 | 0 |
|---|---|---|---|---|---|---|---|---|---|---|
| 1 | 9.22 | 5.86 | 5.23 | 7.49 | 6.15 | 6.18 | 7.06 | 6.26 | 6.95 | 6.21 |
| 2 | 8.24 | 12.96 | 10.63 | 11.37 | 11.41 | 12.23 | 11.55 | 12.24 | 10.88 | 10.68 |
| 3 | 6.18 | 8.95 | 10.91 | 8.46 | 9.82 | 8.80 | 9.08 | 9.46 | 8.46 | 8.08 |
| 4 | 11.71 | 12.65 | 11.18 | 14.42 | 12.80 | 13.60 | 12.83 | 12.90 | 13.60 | 12.41 |
| 5 | 10.52 | 13.89 | 14.21 | 14.01 | 15.78 | 14.28 | 14.03 | 14.55 | 14.11 | 12.56 |
| 6 | 10.74 | 15.12 | 12.93 | 15.12 | 14.51 | 16.03 | 14.58 | 14.83 | 14.51 | 14.29 |
| 7 | 8.35 | 9.72 | 9.08 | 9.71 | 9.70 | 9.92 | 10.91 | 9.75 | 9.47 | 9.53 |
| 8 | 14.43 | 20.06 | 18.43 | 19.00 | 19.58 | 19.65 | 18.98 | 21.24 | 19.24 | 18.04 |
| 9 | 14.97 | 16.66 | 15.40 | 18.72 | 17.74 | 17.96 | 17.23 | 17.99 | 19.85 | 17.32 |
| 0 | 9.33 | 11.42 | 10.27 | 11.93 | 11.03 | 12.35 | 12.10 | 11.77 | 12.09 | 13.86 |

NORMALIZED "SECOND-DIFFERENCE" COMPARISON

FIG. 36

| INPUT PATTERN | REFERENCE PATTERN 1 | 2 | 3 | 4 | 5 | 6 | 7 | 8 | 9 | 0 |
|---|---|---|---|---|---|---|---|---|---|---|
| 1 | 23.58 | 5.19 | 3.35 | 17.73 | 6.96 | 7.66 | 11.52 | 9.76 | 17.88 | 9.70 |
| 2 | 7.97 | 36.22 | 15.10 | 19.07 | 15.59 | 29.90 | 18.21 | 28.82 | 12.86 | 15.25 |
| 3 | 5.68 | 16.68 | 40.00 | 12.87 | 28.94 | 14.32 | 20.00 | 27.75 | 14.13 | 17.37 |
| 4 | 15.78 | 11.04 | 6.75 | 20.98 | 10.01 | 14.78 | 11.52 | 11.74 | 14.53 | 10.86 |
| 5 | 10.26 | 14.96 | 25.15 | 16.59 | 34.76 | 17.45 | 19.64 | 21.10 | 20.76 | 10.66 |
| 6 | 9.75 | 24.79 | 10.75 | 21.17 | 15.08 | 30.03 | 19.01 | 19.01 | 14.60 | 17.32 |
| 7 | 10.94 | 4.26 | 11.20 | 12.30 | 12.66 | 14.18 | 22.41 | 12.05 | 13.43 | 15.81 |
| 8 | 16.29 | 31.31 | 27.30 | 22.03 | 23.88 | 24.91 | 21.16 | 39.34 | 22.43 | 21.57 |
| 9 | 22.65 | 10.60 | 10.55 | 20.69 | 17.84 | 14.52 | 18.57 | 17.03 | 29.87 | 14.09 |
| 0 | 16.29 | 16.68 | 17.20 | 20.50 | 12.14 | 22.84 | 27.94 | 20.71 | 18.68 | 39.60 |

Nov. 26, 1968 L. P. HORWITZ ET AL 3,413,602

DATA CONVERSION TECHNIQUES FOR PRODUCING AUTOCORRELATION FUNCTIONS

Original Filed July 25, 1960 30 Sheets-Sheet 18

Nov. 26, 1968 L. P. HORWITZ ET AL 3,413,602

DATA CONVERSION TECHNIQUES FOR PRODUCING AUTOCORRELATION FUNCTIONS

Original Filed July 25, 1960 30 Sheets-Sheet 23

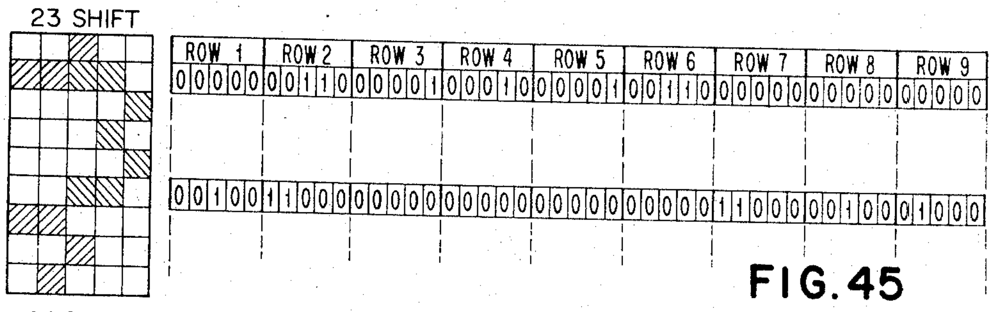
FIG. 45
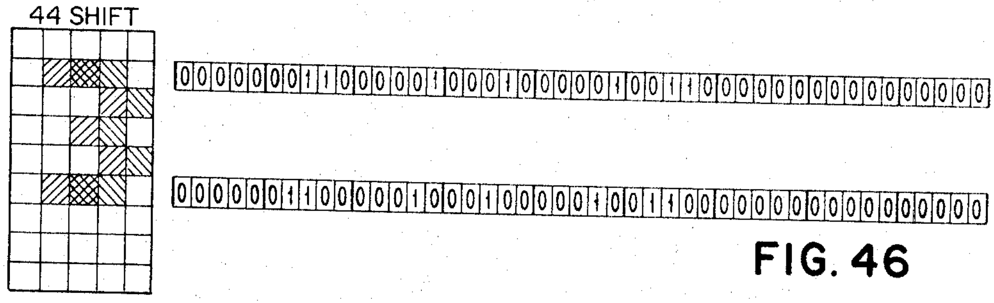
FIG. 46
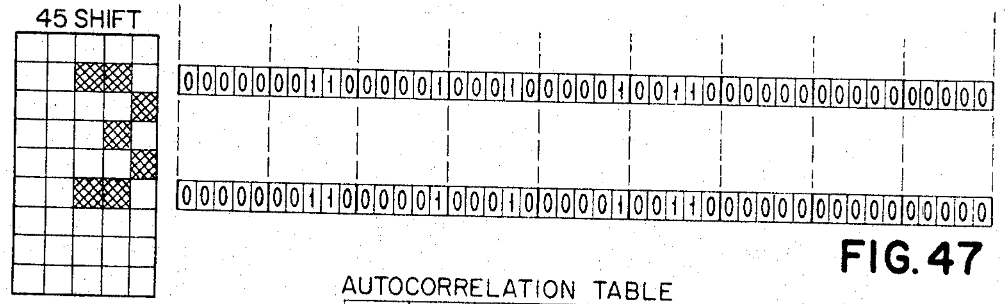
FIG. 47
AUTOCORRELATION TABLE
| | | | | |
|---|---|---|---|---|
| 23 | 24 | 25 | 26 | 27 |
| 0 | 1 | 2 | 1 | 0 |
| 28 | 29 | 30 | 31 | 32 |
| 1 | 1 | 0 | 1 | 1 |
| 33 | 34 | 35 | 36 | 37 |
| 0 | 1 | 3 | 1 | 0 |
| 38 | 39 | 40 | 41 | 42 |
| 1 | 2 | 0 | 2 | 1 |
| 43 | 44 | 0 | 1 | 2 |
| 0 | 2 | 7 | 2 | 0 |
| 3 | 4 | 5 | 6 | 7 |
| 1 | 2 | 0 | 2 | 1 |
| 8 | 9 | 10 | 11 | 12 |
| 0 | 1 | 3 | 1 | 0 |
| 13 | 14 | 15 | 16 | 17 |
| 1 | 1 | 0 | 1 | 1 |
| 18 | 19 | 20 | 21 | 22 |
| 0 | 1 | 2 | 1 | 0 |
FIG. 48

Nov. 26, 1968 L. P. HORWITZ ET AL 3,413,602
DATA CONVERSION TECHNIQUES FOR PRODUCING AUTOCORRELATION FUNCTIONS
Original Filed July 25, 1960
30 Sheets-Sheet 27
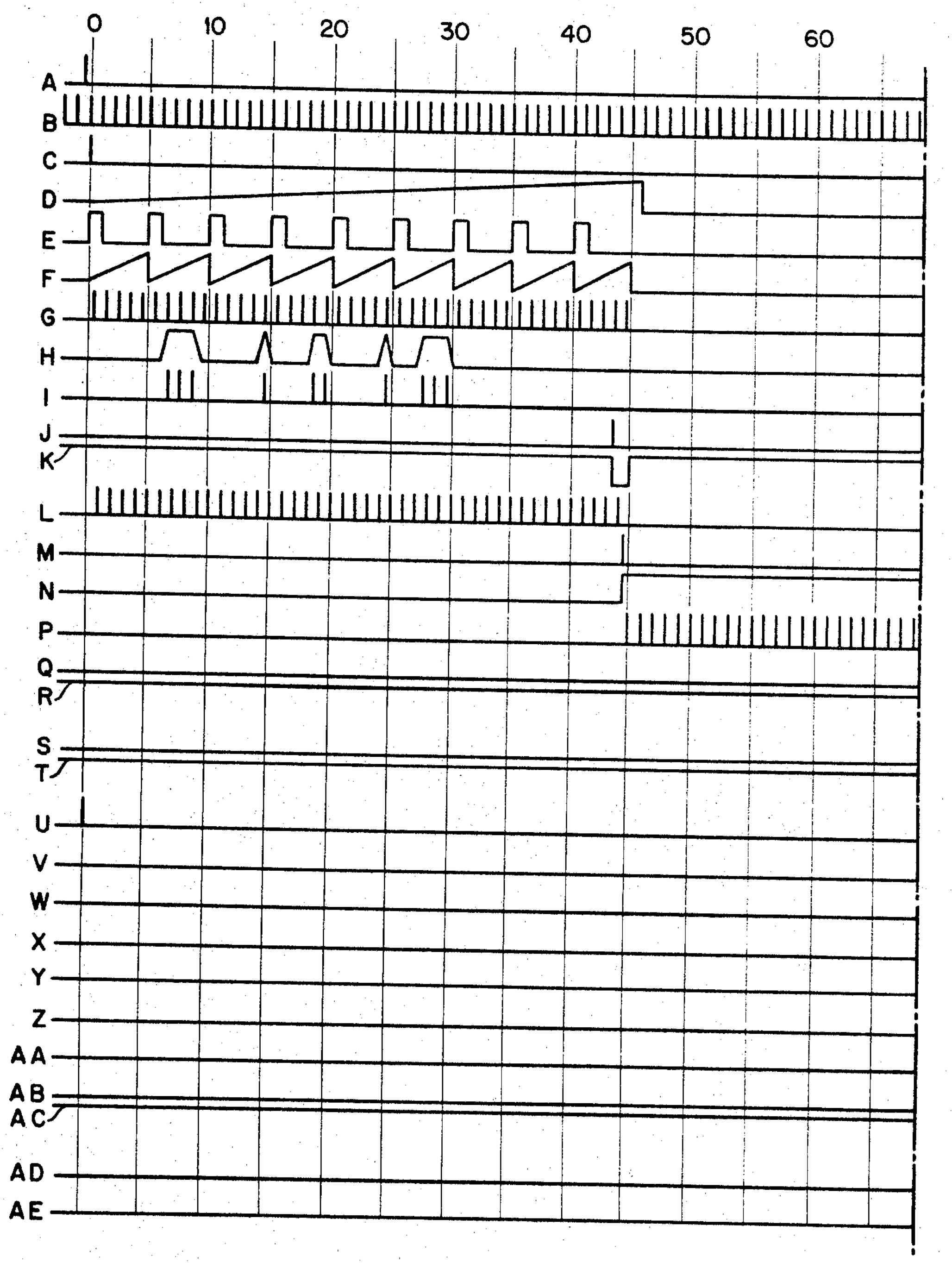
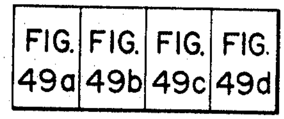
FIG. 49
FIG. 49a

United States Patent Office 3,413,602
Patented Nov. 26, 1968

3,413,602

DATA CONVERSION TECHNIQUES FOR PRODUCING AUTOCORRELATION FUNCTIONS

Lawrence P. Horwitz, Geneva, Switzerland, and Glenmore L. Shelton, Jr., Carmel, N.Y., assignors to International Business Machines Corporation, New York, N.Y., a corporation of New York

Original application July 25, 1960, Ser. No. 45,034, now Patent No. 3,196,392, dated July 20, 1965. Divided and this application Oct. 12, 1964, Ser. No. 403,262
6 Claims. (Cl. 340—146.3)

ABSTRACT OF THE DISCLOSURE

A data conversion system for converting an $n$-dimensional array of data into a lower dimensional array of data embodied as a specimen identification system. In the embodiment an input specimen is scanned by an optical scanner and is stored in $n$-dimensional (i.e., two dimensional) form in a digital matrix wherein black portions of the specimen may be represented by one bits and white portions of the specimen may be represented by zero bits. The data elements which are stored in the matrix in the $n$-dimensional array are converted into an $m$-dimensional (i.e., one dimensional) array by transferring the data elements into a shift register such that either the rows or the columns of the data elements of the digital matrix are arranged in tandem. To prevent ambiguity, a trivial one-dimensional array of data is stored in the $m$-dimensional array in between each adjacent group of data elements from each row or column. The data elements of the $n$-dimensional array are also stored as a second $m$-dimensional array in a second shift register. The second register is shifted with respect to the first shift register and comparisons are made of the coincidence of one bits in similar storage positions in each storage means. The comparisons of the one bits which occur as the second storage means is shifted with respect to the first storage means are used to form the autocorrelation function of the input specimen.

This is a divisional application for an invention presented in an application, Ser. No. 45,034, filed on July 25, 1960, and now Patent No. 3,196,392, by Lawrence P. Horwitz and Glenmore L. Shelton, Jr.

The present invention relates to data conversion techniques and, in particular, to techniques for converting an $n$-dimensional array of data into a lower-dimensional array of data. The invention is shown and described in a specimen identification (pattern recognition) environment wherein a two-dimensional scanned pattern is converted into a one-dimensional pattern (time-varying sequence of data).

A two-dimensional pattern can be converted into a one-dimensional pattern by dividing the two-dimensional pattern into one-dimensional columns or rows which are arranged in tandem. For example, when a pattern is scanned by a raster (sequential scan with adjacent lines that encompass the two-dimensional area) a one-dimensional sequence of data is produced. Television cameras conventionally scan in this manner.

The one-dimensional pattern that is developed by sequentially scanning rows or columns in a two-dimensional pattern is useful for many applications but is not especially suitable for use in pattern recognition systems which employ autocorrelation function analysis. As described in detail below, these recognition systems analyze the pattern to be identified as a function of data at predetermined relative locations. In this case, when the two-dimensional pattern is simply converted into a one-dimensional pattern by arranging rows or columns in tandem, ambiguity and errors are introduced, e.g., adjacent data elements in the one-dimensional pattern may represent adjacent data elements along a single row or column or may represent the last data element from one row or column and the first data element from the next row or column.

In the present invention, the ambiguity is eliminated by placing a trivial one-dimensional array (sequence) of data in the one-dimensional pattern in between the data corresponding to each adjacent column or row. For example, when a two-dimensional pattern is converted into a one-dimensional pattern by dividing the two-dimensional pattern into ten rows of data, then nine trivial arrays (e.g., all zeros) of data are employed, where each trivial array is placed between the data corresponding to a row of the two-dimensional pattern. Ambiguity is completely eliminated when the trivial one-dimensional arrays contain a number of data elements that is equal to at least one less than the number of data elements in the sequentially scanned row or column.

It is thus an object of the present invention to provide techniques for converting an $n$-dimensional path or array of data elements into a lower-dimensional pattern or array of data elements.

Another object of the present invention is to provide techniques for converting a two-dimensional pattern or array of data elements into a one-dimensional pattern or array of data elements.

A further object is to provide techniques for converting an $n$-dimensional pattern or array of data elements into an $m$-dimensional pattern or array of data elements (where $n$ is greater than $m$) by placing trivial arrays of data elements in the $m$-dimensional array at various locations.

The foregoing and other objects, features and advantages of the invention will be apparent from the following more particular description of the invention.

The invention is shown in an environment utilizing autocorrelation functions for specimen identification (pattern recognition).

In accordance with the invention, an autocorrelation function of the specimen is generated electronically or optically and compared with autocorrelation functions of reference patterns to provide an indication of the identity of the specimen. The autocorrelation function is a measure of the correlation of a function with itself and is thus inherently registration invariant. If the specimen to be identified is considered to be a matrix of discrete areas having coordinates $(x, y)$ that are predominantly black or predominantly white, depending then upon the positions of the lines that the specimen comprises, there is a function $f(x, y)$ that is "1" for each instance where the area about the coordinates $(x, y)$ is black and "0"

where white. The autocorrelation function defines the number of pairs of black areas separated by a given distance in a given direction, over all distances and directions. If $(x, y)$ is a point on the pattern, and $(x+x', y+y')$ is another point on the pattern separated from the point $(x, y)$ by $(x', y')$, then the product $$(x, y)\ (x+x', y+y')=1$$

only where both points are black. Since this procedure is performed on every pair of points in the pattern, the autocorrelation function $D(x', y')$ is defined as:

$$D(x', y')=\sum_{x,y} f(x, y)f(x+x', y+y')$$

The autocorrelation function $D_S(x', y')$ of the specimen S is then compared, point-by-point, to the normalized autocorrelation functions $Z_R(x', y')$ of all reference patterns R, where $Z_{Rn}(x', y')$ of reference pattern R$n$ is defined as:

$$Z_{Rn}(x', y')=\frac{D_{Rn}(x', y')}{\left[\sum_{x', y'} D_{Rn}^2(x', y')\right]^{1/2}}$$

The comparison $S_{S,Rn}$ of $D_S(x', y')$ and $Z_{Rn}(x', y')$ is effected as follows:

$$S_{S,Rn}=\sum_{x', y'} D_s(x', y')\cdot Z_{Rn}(x', y')$$

The reference pattern $n$ that produces the largest comparison sum determines the identification of the specimen. The reference pattern autocorrelation function must be normalized to guarantee that the largest sum will be caused by the reference pattern that is similar to the specimen. A Schwartz inequality, as found on page 417 of a text authorized by Wilfred Kaplan, entitled Advanced Calculus, 1952, published by the Addison-Wesley Publishing Co., may be used to show that, $$\sum_{x', y'} \frac{D_S(x', y')\cdot D_{Rn}(x' y')}{\left[\sum_{x', y'} D_{Rn}^2(x', y')\right]^{1/2}}$$

is a maximum when $D_S(x', y')=D_{Rn}(x', y')$.

Some functions of the autocorrelation function have been found to provide better specimen identification than is achieved by using the autocorrelation function itself, either by improving the distinction between patterns having certain similarities, or by "smoothing" small differences between essentially-similar patterns, such as "1" with and without a serif. One of the "discriminating" functions which improves distinction, the normalized "second-difference" function of the autocorrelation function is explained in detail in Topic 6 below. Specimen identification using the autocorrelation function and the "second-difference" function of the autocorrelation function of the reference patterns are shown with respect to the electronic embodiment and the advantage of the latter is shown. The "second-difference" function is only one of many "discriminating" functions of the autocorrelation function that provide improved specimen identification.

One of the "smoothing" functions which overrides small differences, the normalized "averaging" functions of the autocorrelation function is also explained in detail in Topic 6.

Two optical embodiments are shown: one compares Fraunhofer diffraction patterns of Fraunhofer diffraction patterns of the specimen to be identified to similar patterns of reference patterns; the other compares autocorrelation function patterns of the specimen to those of reference patterns.

Fraunhofer diffraction patterns are discussed in detail in a text authored by Francis Weston Sears, entitled Optics, 1949, published by the Addison-Wesley Publishing Co., Library of Congress classification QC355.S45, in chapter 9. A Fraunhofer diffraction pattern is a power spectrum which is the square of the Fourier transform of the input pattern, as shown in a book authored by Georg Joos and entitled Theoretical Physics, 1958, published by the Hofner Publishing Co., Library of Congress classification QC20.J62, on pages 379–390. Since the autocorrelation-function is a Fourier cosine transform of the power spectrum of the input, as shown in a text authored by C. Kittel, entitled Elementary Statistical Physics, 1958, published by John Wiley, Library of Congress classification QC175.K58, on page 135. A Fraunhofer diffraction pattern of a Fraunhofer diffraction pattern is a function of the autocorrelation function. Since a Fraunhofer diffraction pattern is inherently registration invariant as shown in the Sears reference on page 233, the resulting function of the autocorrelation function that is obtained by developing a diffraction pattern of a diffraction pattern is also registration invariant.

In order to aid one skilled in the art in practicing the invention, two optical embodiments are provided that permit specimen identification while the document containing the specimen is in motion and an electronic embodiment is shown that includes a special-purpose digital computer to obtain autocorrelation functions.

FIGURES 6 through 13 are diagrams showing the basic digital symbols used in FIGURES 14 through 24 and 37.

Figure 23A:
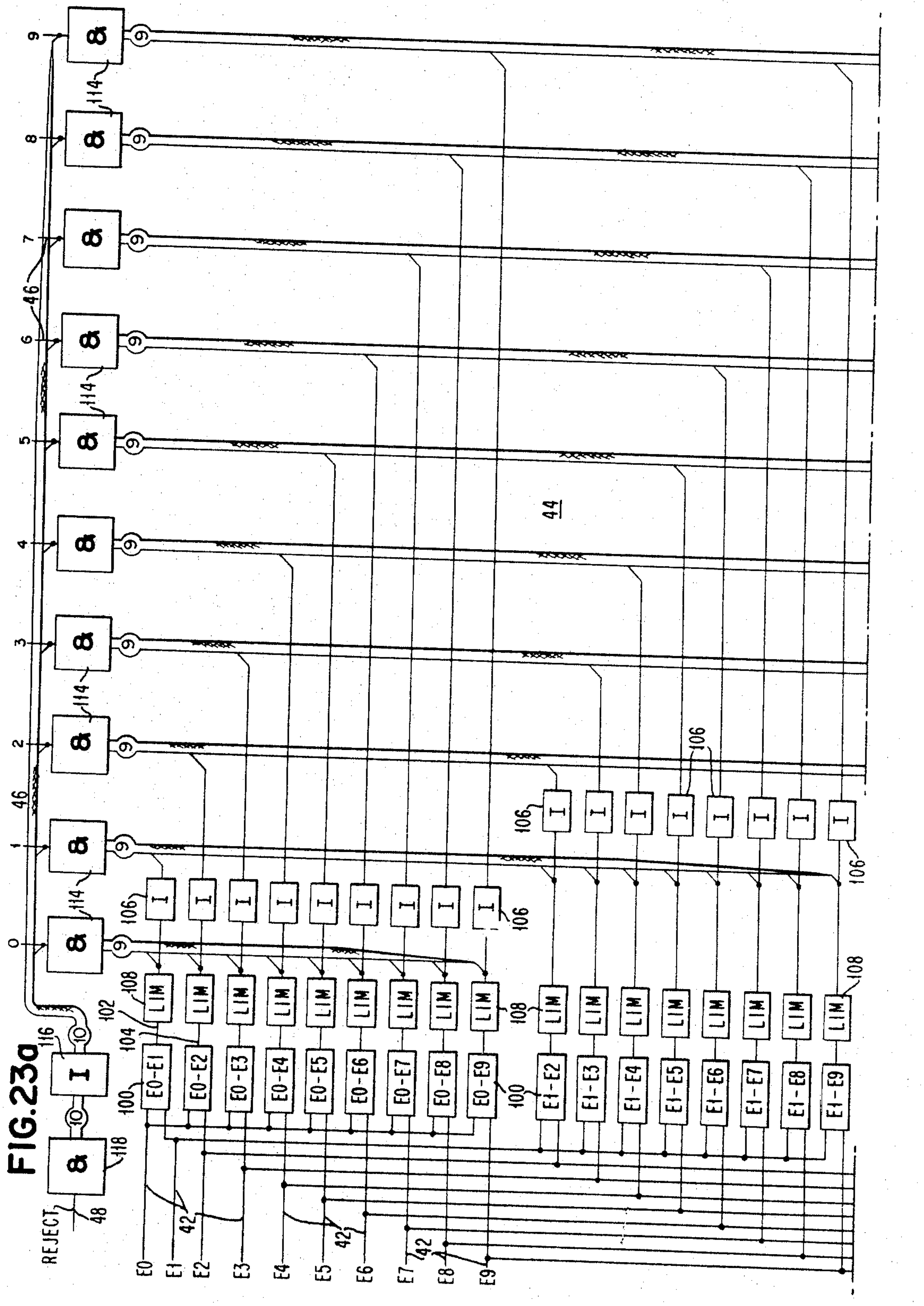
Figure 23B:
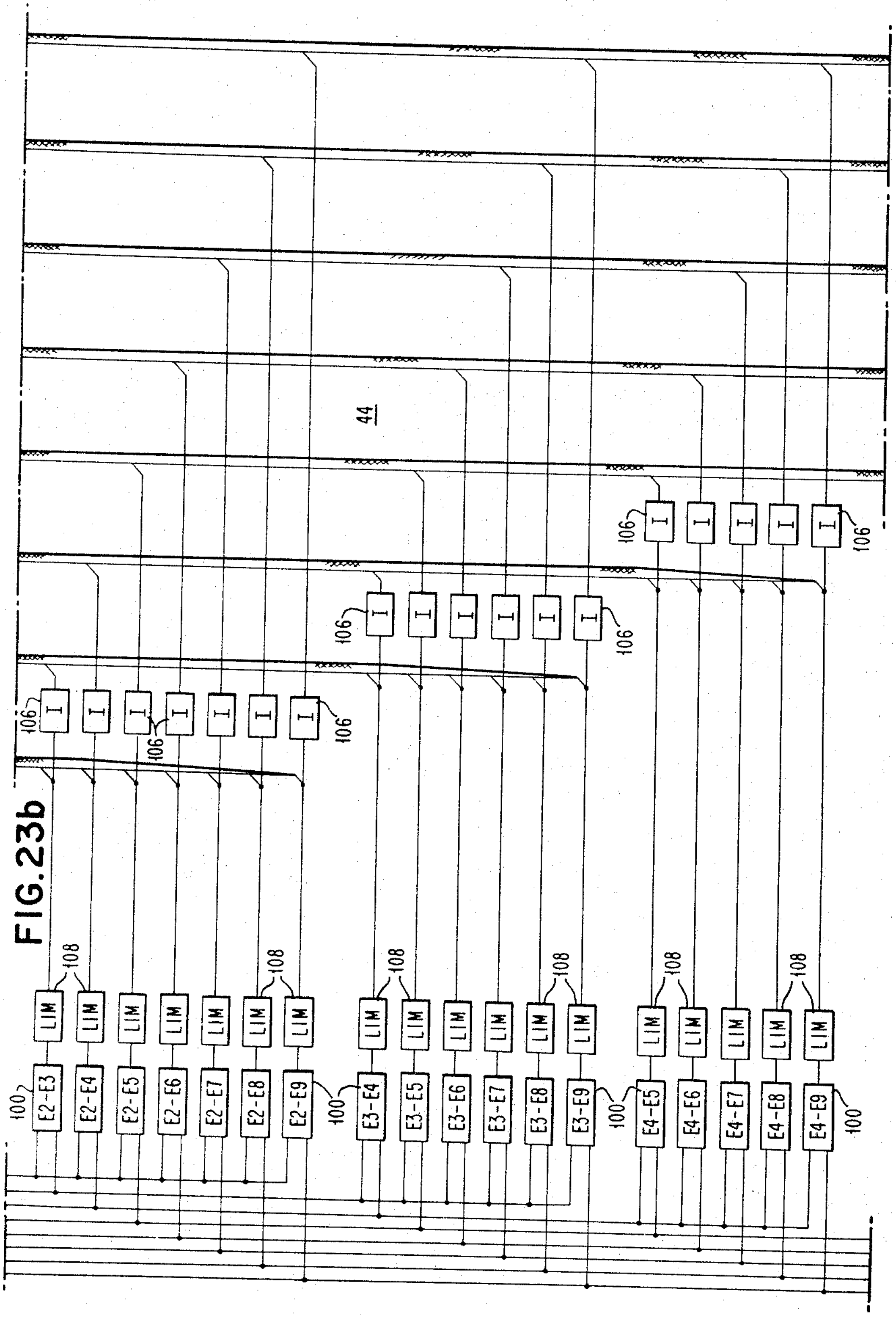
Figure 23C:
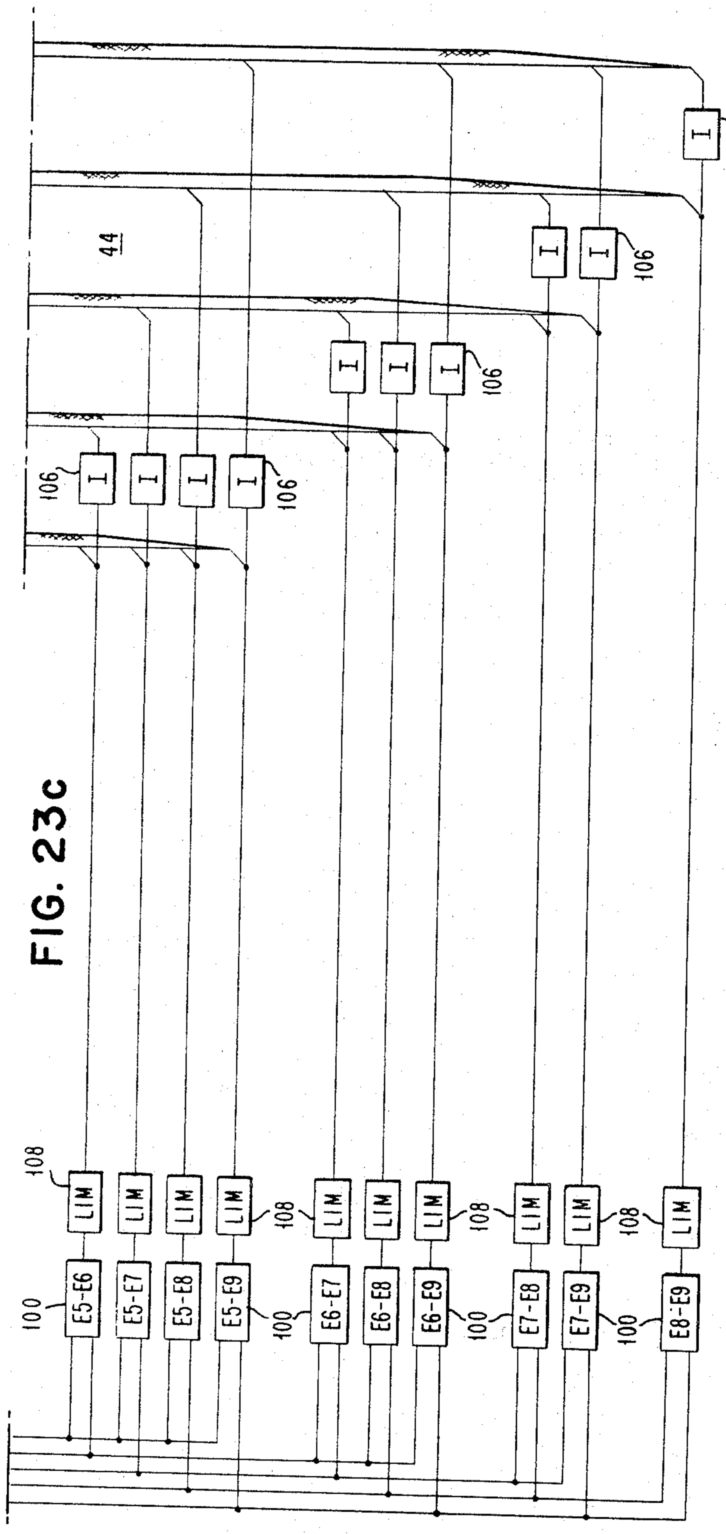
Figure 24:
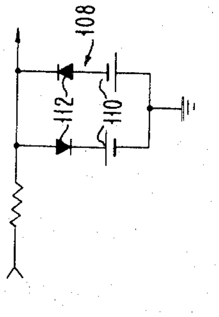
Figure 23:
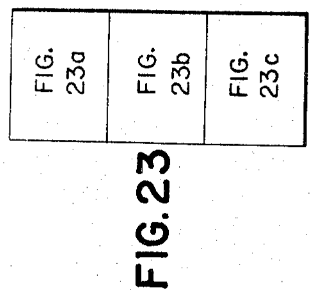
Figure 39A:
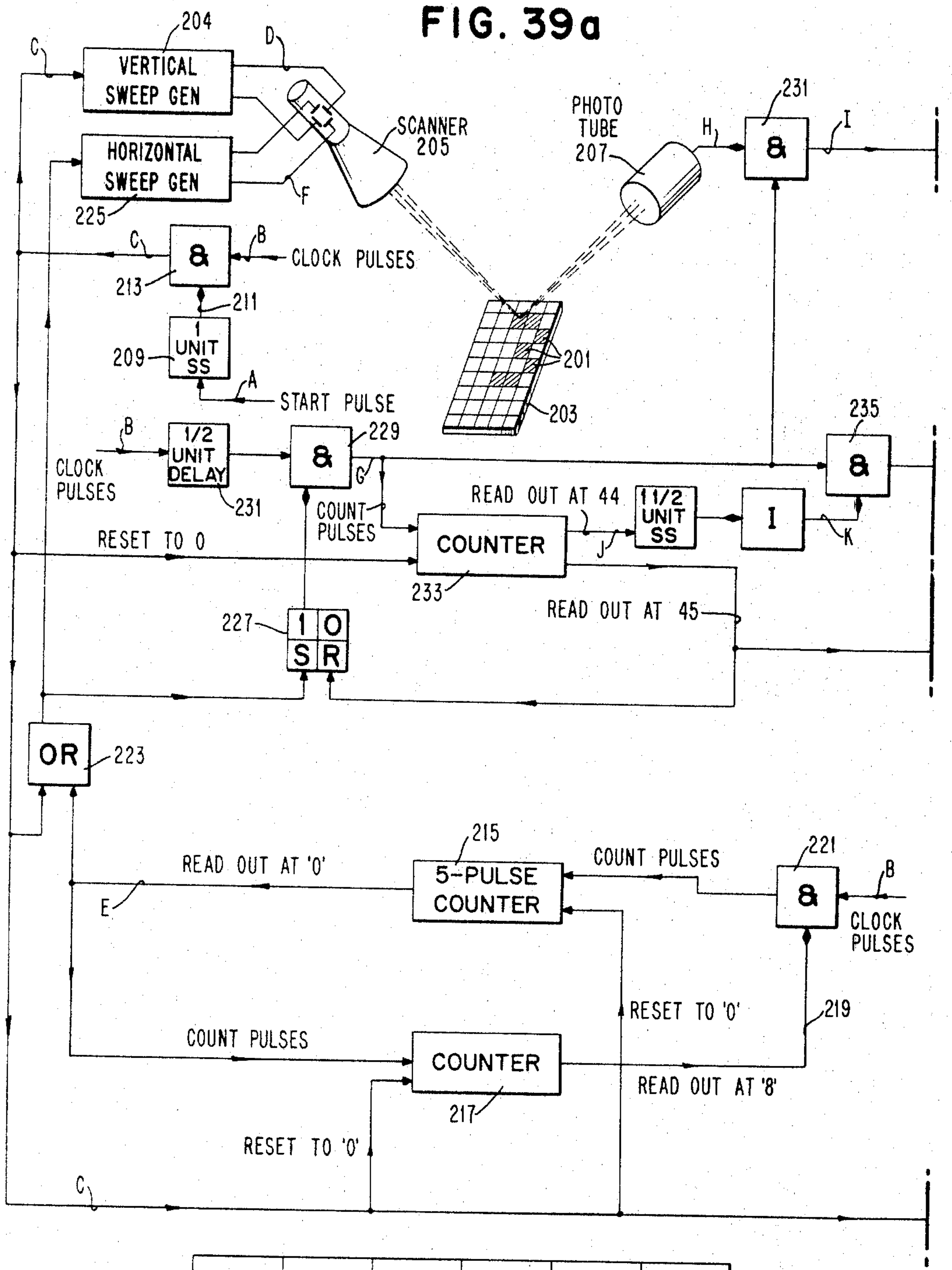
Figure 39:
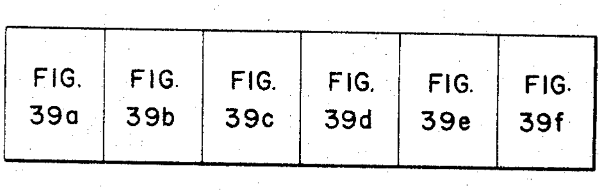

FIGURES 14 through 22 are schematic diagrams showing the basic digital circuits used in FIGURES 23, 24 and 39.

FIGURE 23 illustrates how composite FIGURES 23A, 23B and 23C should be arranged.

Figure 1:
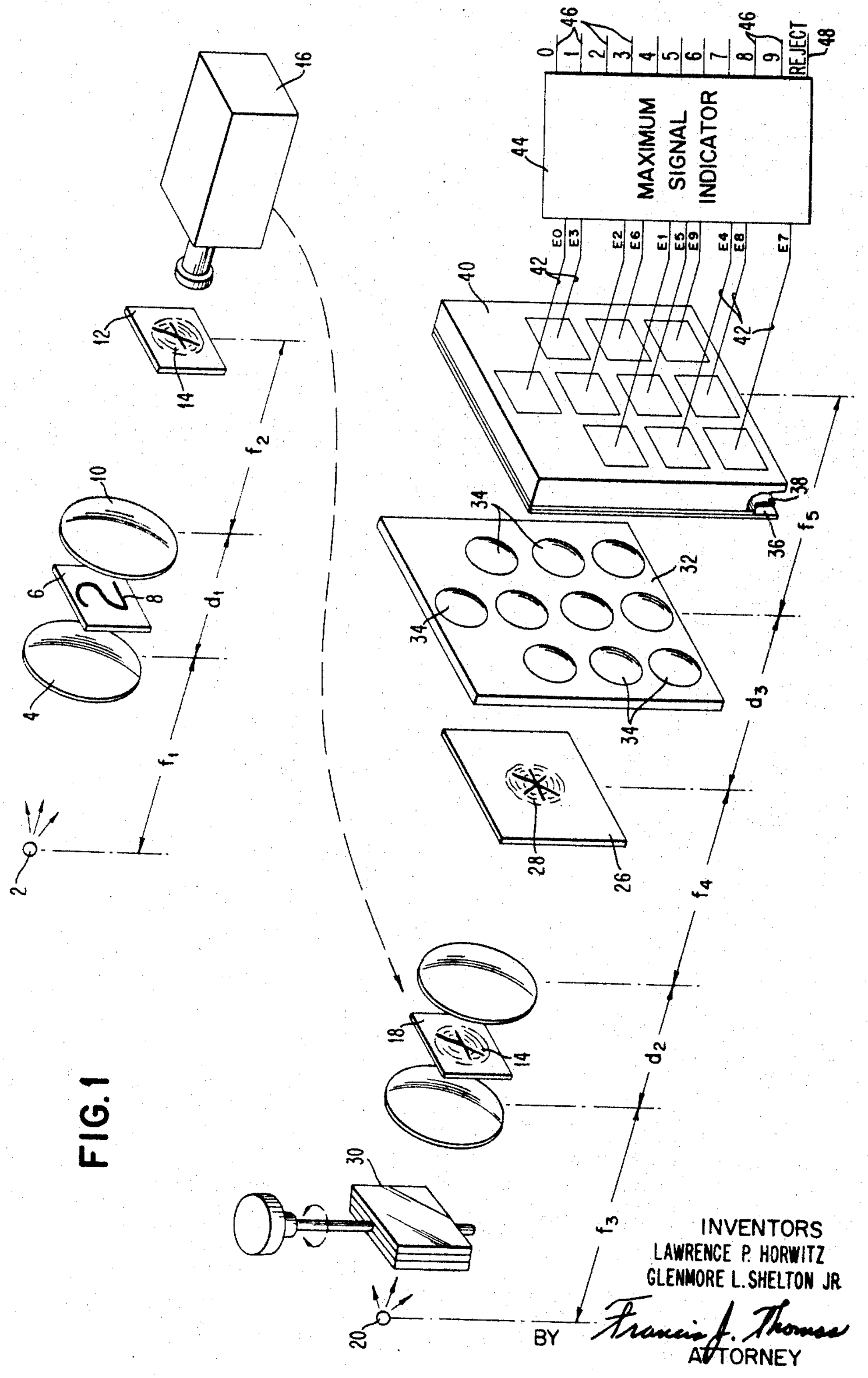
FIGURE 1 is a functional diagram of an optical embodiment utilizing comparisons of Fraunhofer diffraction patterns of Fraunhofer diffraction patterns for identification.
Figure 2:
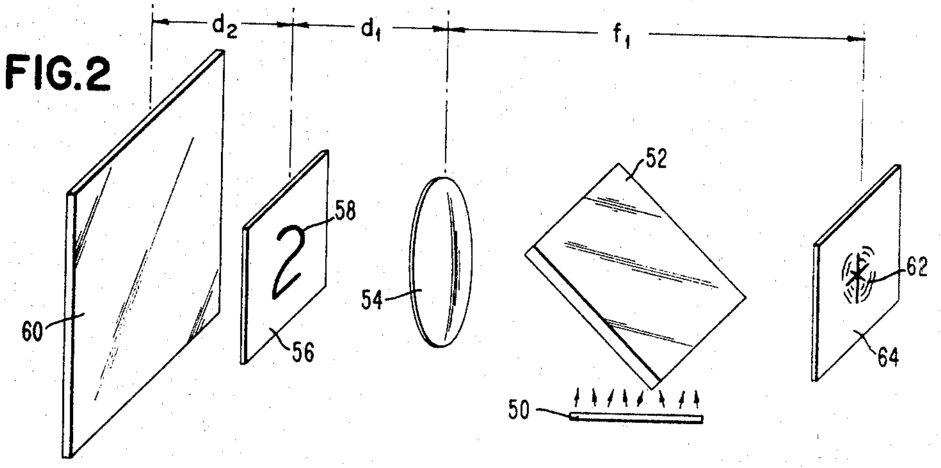
FIGURE 2 is a functional diagram of an embodiment utilizing an optical autocorrelation function generator.
Figure 3:
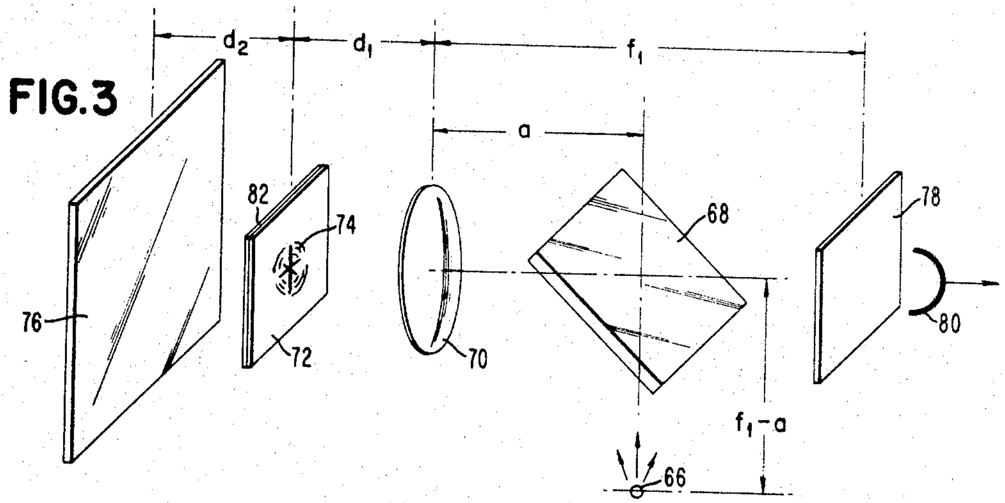
FIGURE 3 is a functional diagram showing a method of normalizing the devices of FIGURES 1 and 2.

FIGURES 23A, 23B and 23C when arranged as shown in FIGURE 3, provide a schematic diagram showing a maximum signal indicator that could be used in the embodiments of FIGURES 1 and 2.

FIGURE 24 is a schematic diagram of a limiter circuit that could be used in the circuit of FIGURE 23.

FIGURES 25 through 32 are a set of explanatory diagrams showing a procedure for generating the autocorrelation function of a typical pattern.

FIGURE 33 is a chart showing the autocorrelation function generated following the procedure in FIGURES 25 through 32.

Figure 34A:
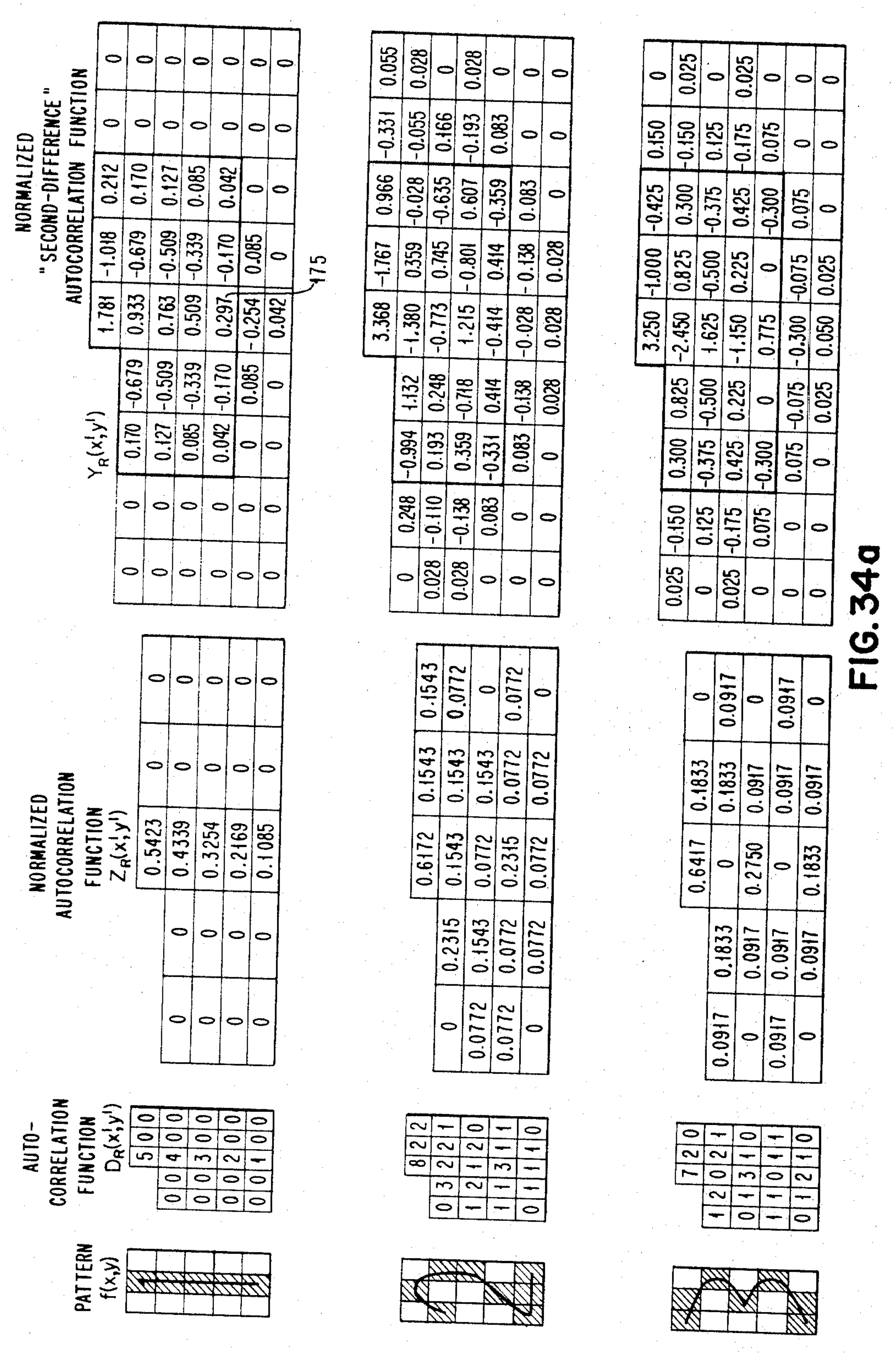
Figure 34C:
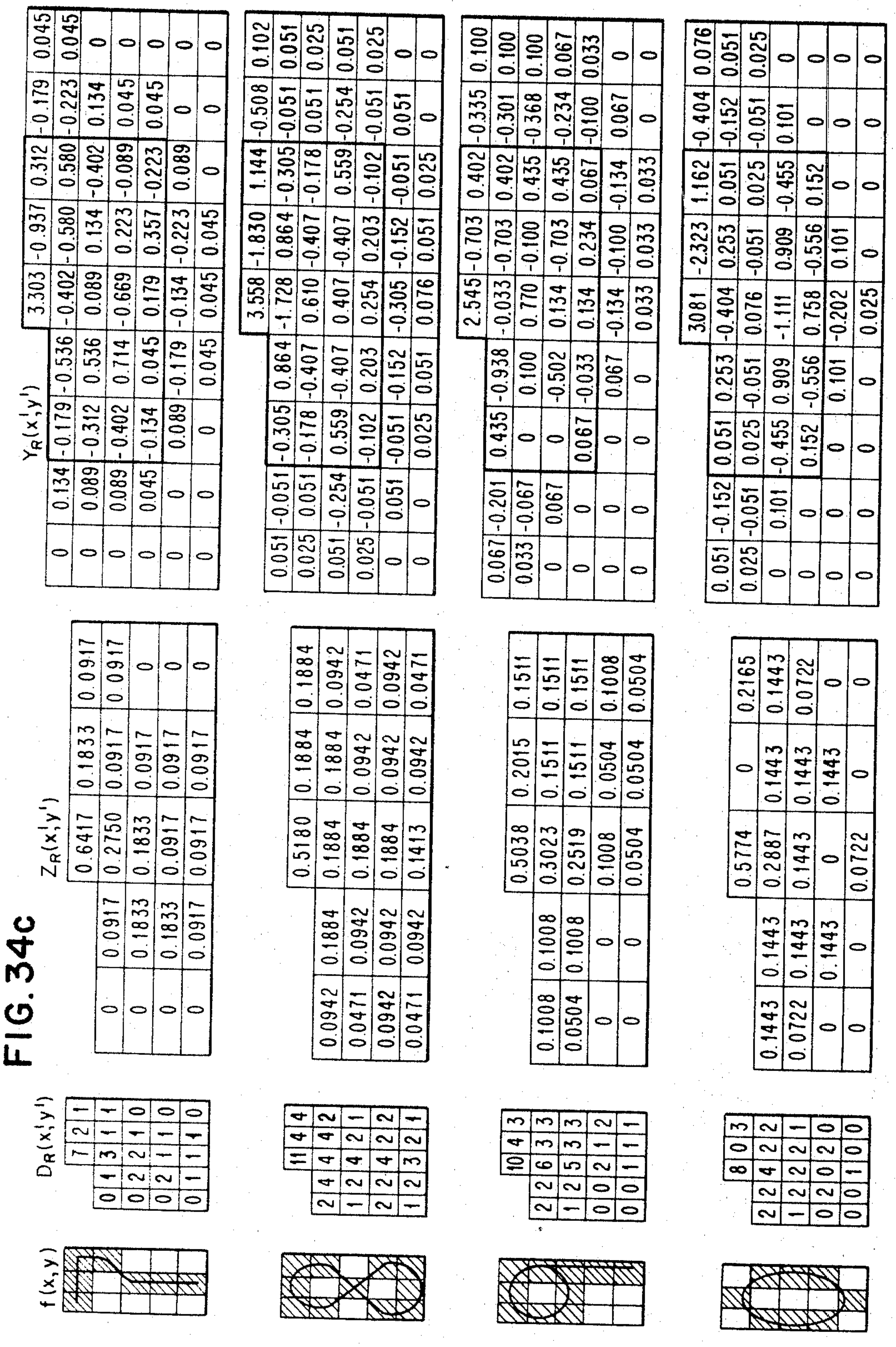

FIGURES 34A, 34B and 34C illustrate a group of autocorrelation functions, normalized autocorrelation functions and normalized "second-difference" functions for ten Arabic numerals.

FIGURE 35 is a chart showing the stability of identification of ten Arabic numerals using autocorrelation function comparison.

FIGURE 36 is a chart showing the stability of identification of ten Arabic numerals using "second-difference" autocorrelation comparison.

Figure 37A:
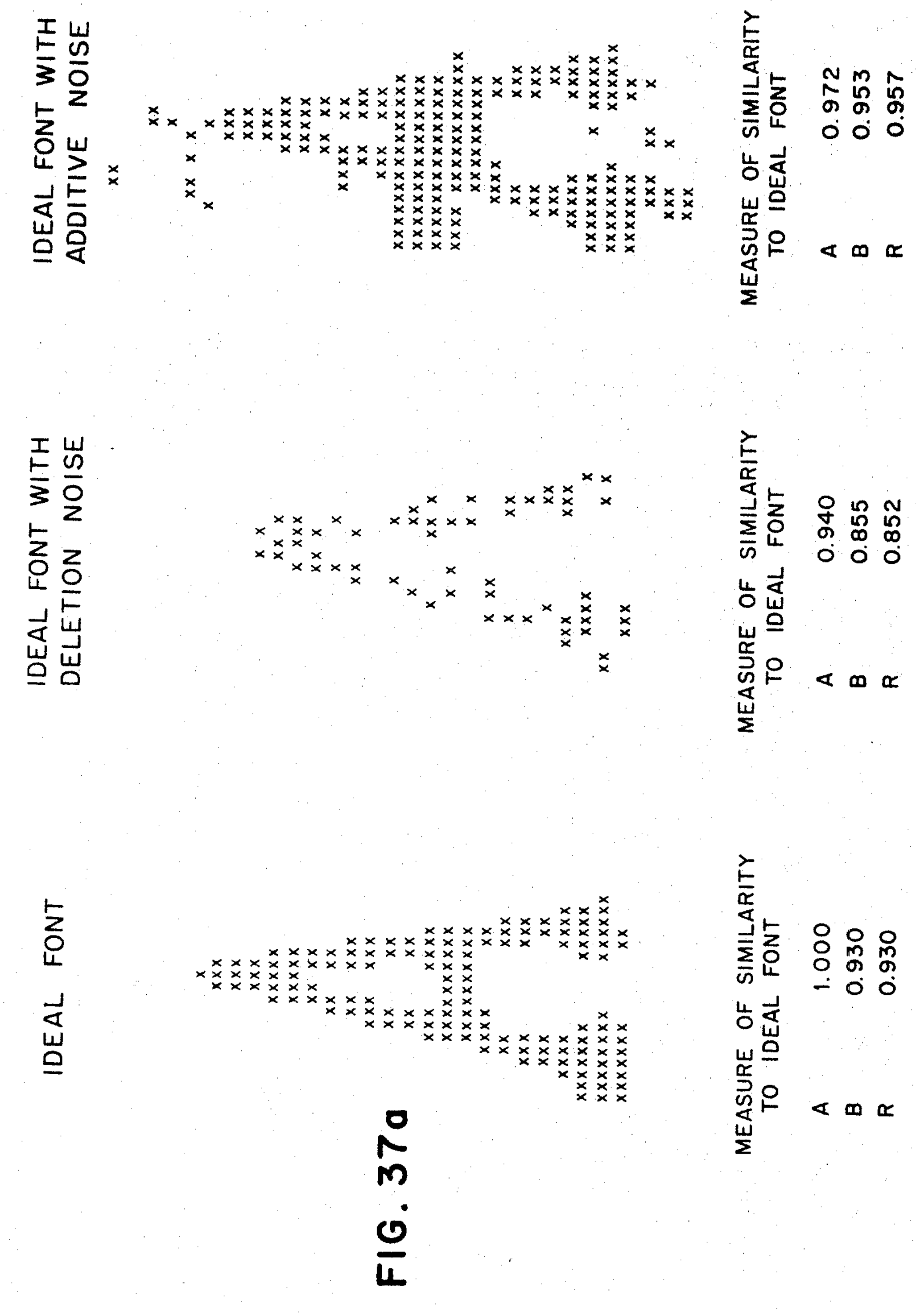
Figure 37B:
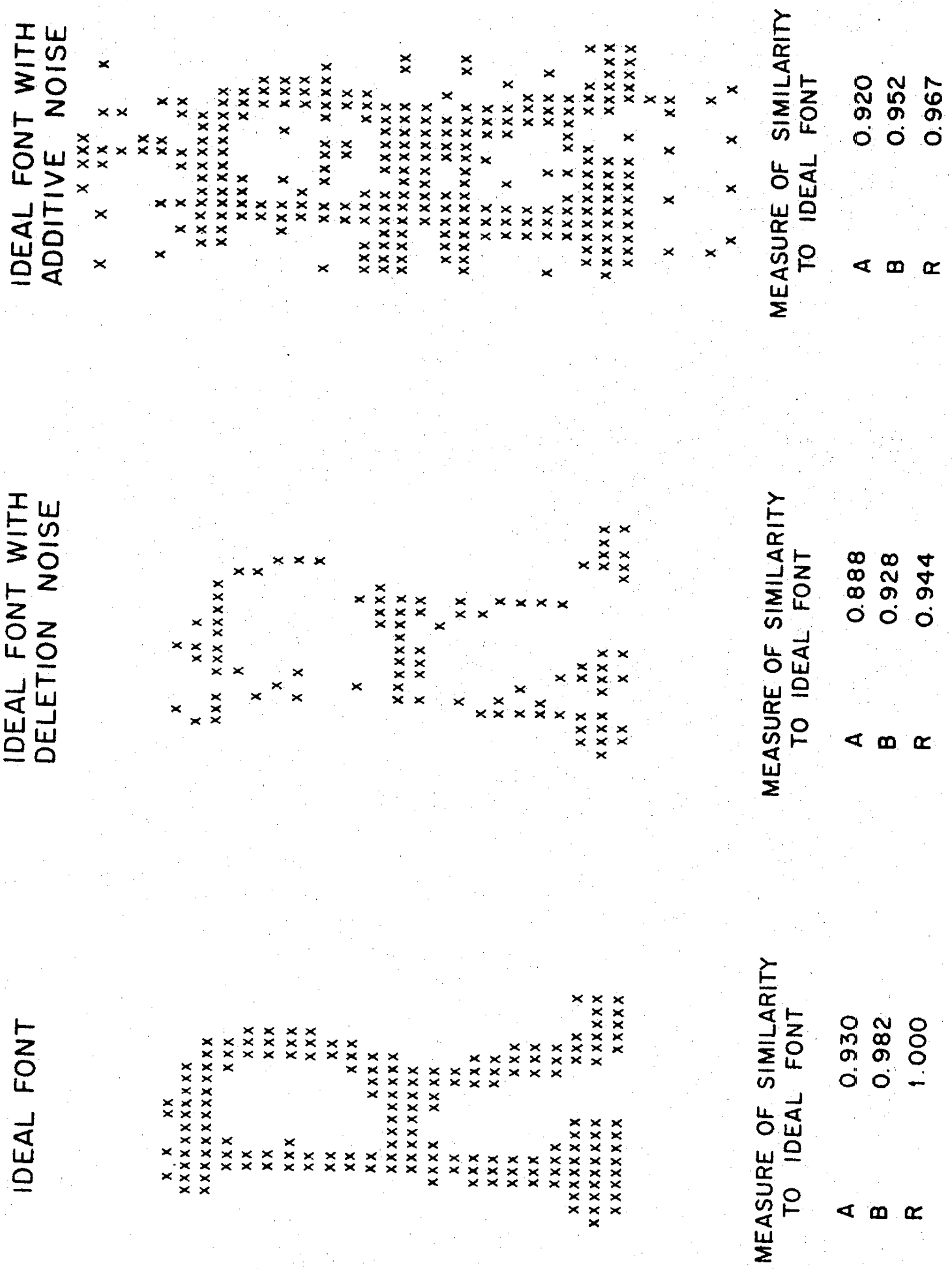

FIGURE 37 and FIGURE 37B illustrate a group of diagrams showing the stability of autocorrelation function specimen identification for typical specimens containing addition and deletion noise.

Figure 38:
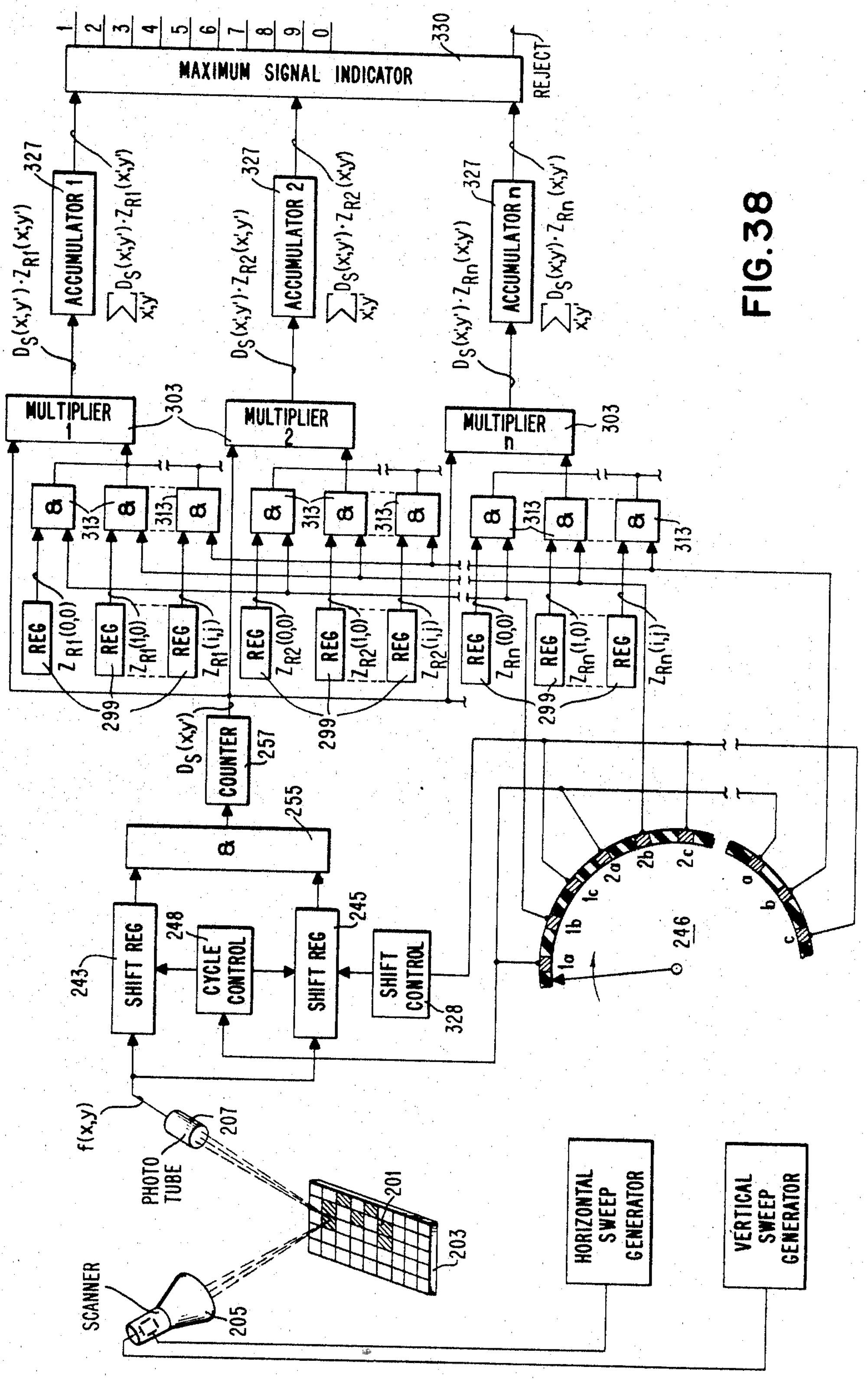

FIGURE 38 is a block diagram of an electronic embodiment of the invention.

FIGURE 39 illustrates how the composite FIGURES 39A, 39B, 39C, 39D, 39E and 39F should be arranged.

FIGURES 39A, 39B, 39C, 39D, 39E and 39F form a schematic diagram of the embodiment shown in FIGURE 38.

FIGURES 40 through 47 are diagrams showing the operation of the shift registers in the diagram in FIGURE 39.

FIGURE 48 is a diagram showing the autocorrelation function generated as a result of the operation of the shift registers shown in FIGURE 39.

Figure 49B:
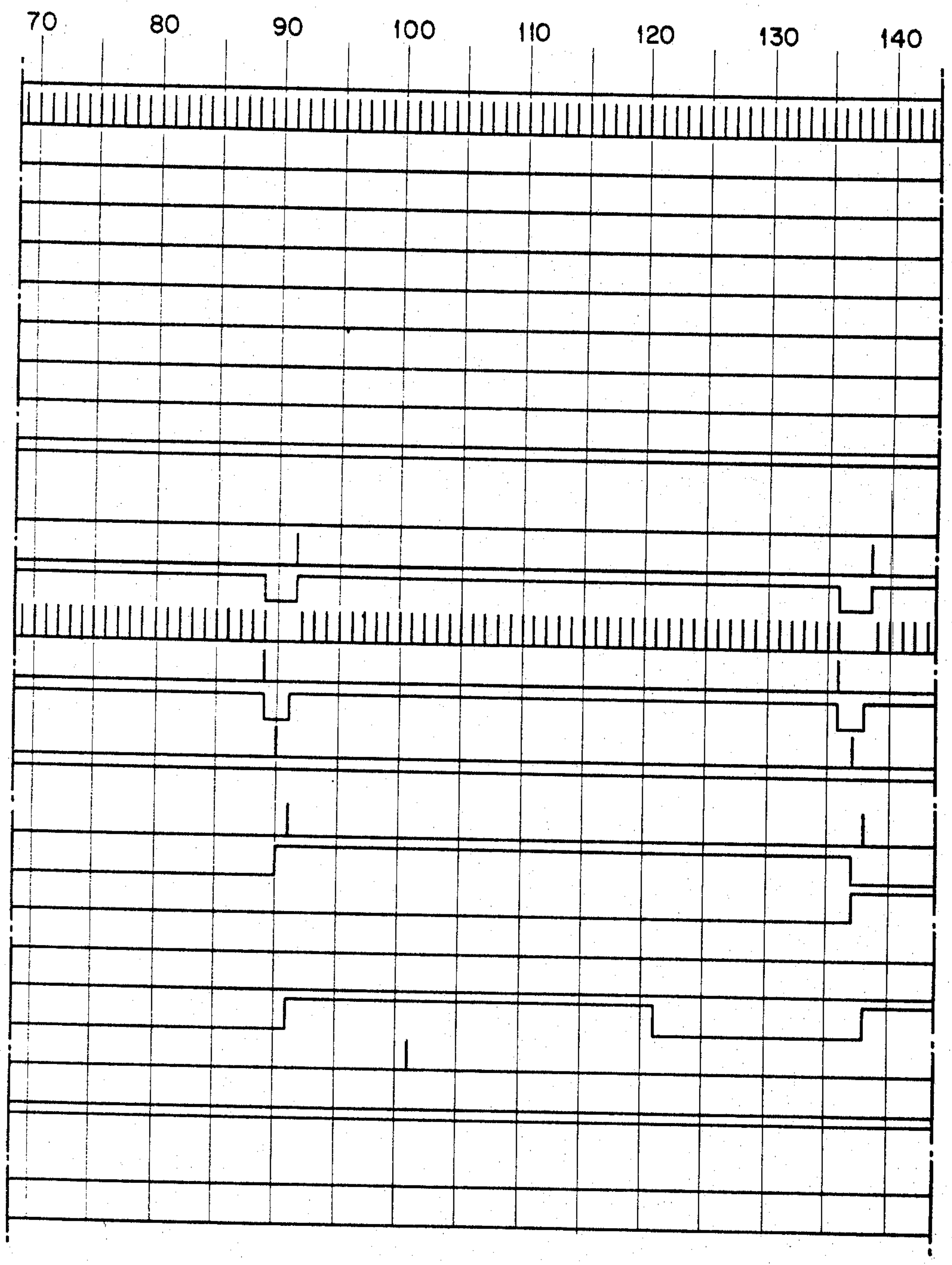
Figure 49C:
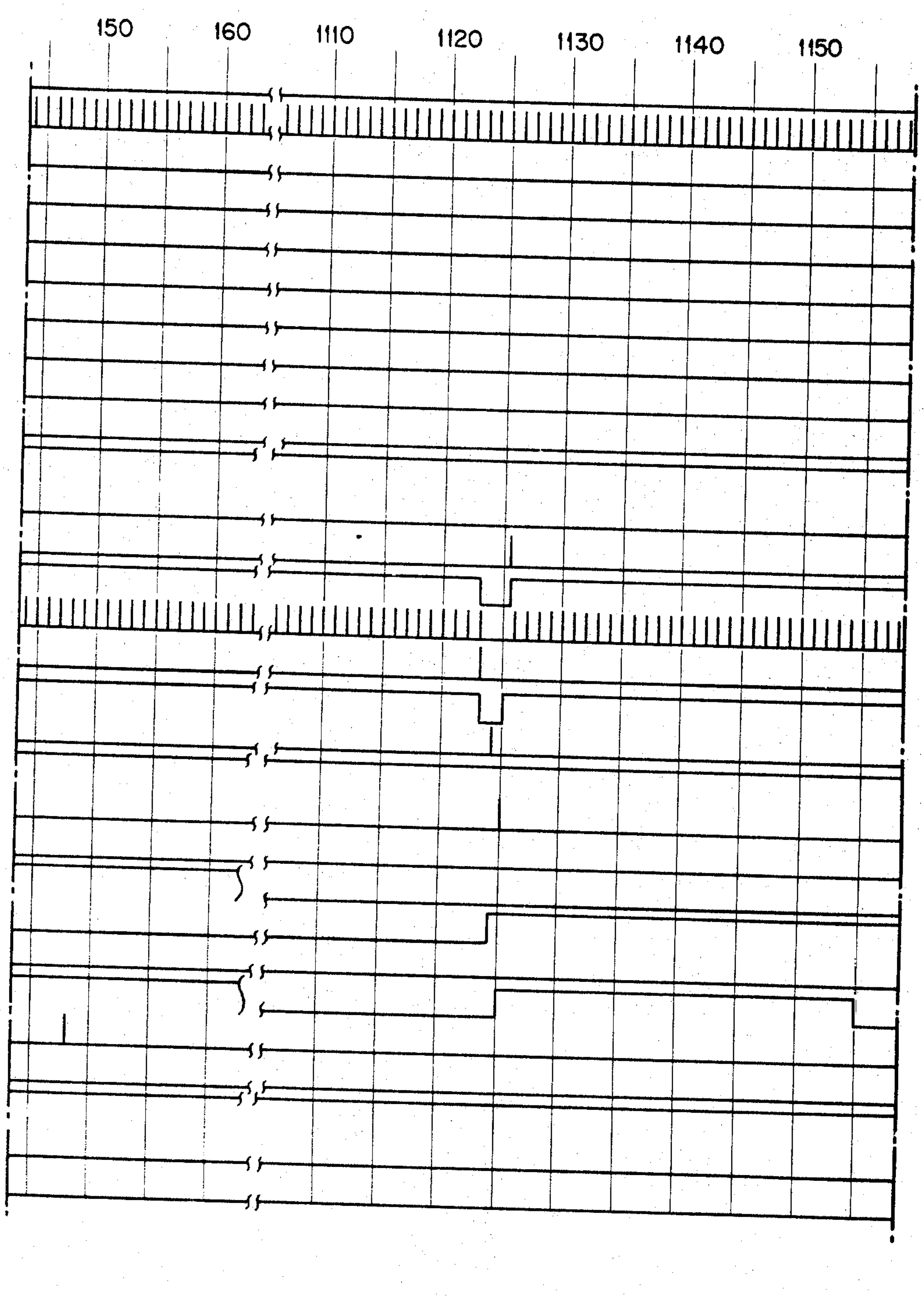
Figure 49D:
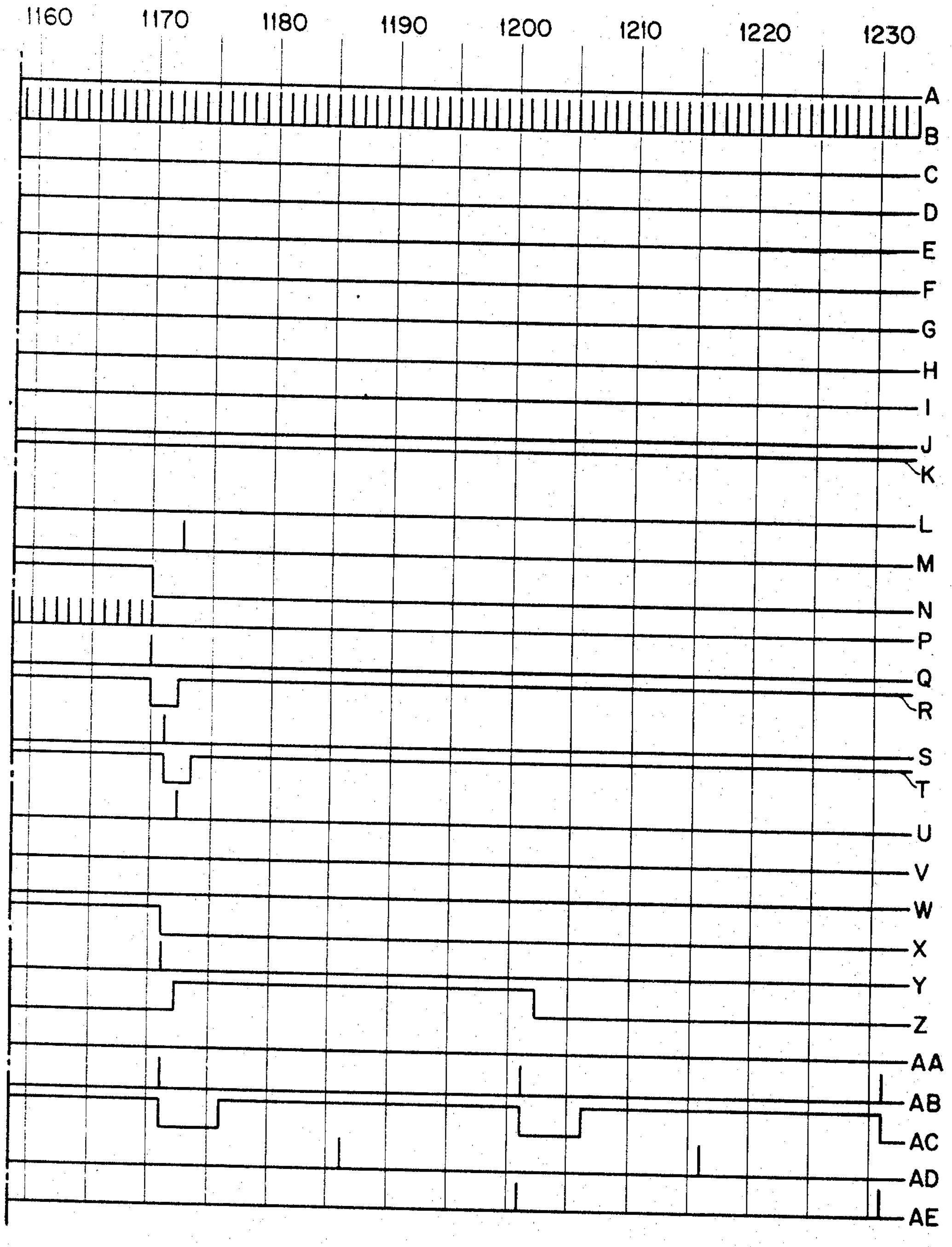

FIGURE 49 illustrates how the composite FIGURES 49A, 49B, 49C and 49D are to be arranged.

FIGURES 49A, 49B, 49C and 49D illustrate a timing diagram showing the operation of the device shown in FIGURE 39.

(1) *First optical embodiment*

One registration invariant method of identifying specimens optically makes use of Fraunhofer diffraction patterns of Fraunhofer diffraction patterns. Referring to FIGURE 1, there is shown a device used to identify Arabic numerals; however, it is not to be considered exclusively limited to this use since the principles embodied may readily be extended by one skilled in the art. A monochromatic point source of light 2, located at a distance ($f_1$) from a lens 4 equal to the focal length of the lens, applies coherent light to the input specimen transparency 6. The transparency 6 contains an input specimen designated by the reference numeral 8. The input specimen can be relatively transparent on a relatively opaque background or relatively opaque on a relatively transparent background as shown. A second lens 10 directs the light energy from the input specimen transparency 6 to a frosted glass plate 12. The distance $d_1$ between the lenses 4 and 10 is not critical as the light passing between them is collimated. The distance $f_2$ between the frosted glass plate 12 and the lens 10 equals the focal length of the lens. A diffraction pattern 14 of the input specimen 8 is developed on the frosted glass plate. Regardless of the location of the input specimen on the transparency, the diffraction pattern appears at the same place on the plate because the pattern position is independent of the position of the specimen as shown in the previously-cited Sears reference on page 233. This phenomenon permits misregistered as well as accurately-registered input specimens to be identified equally well and hence permits movement of the document containing the specimen while the specimen is being identified.

The diffraction pattern is photographed by a camera 16 and a transparency 18 is developed. The transparency is used as the input of a second diffraction pattern generator comprising a monochromatic point source of light 20, two lenses 22 and 24 and a frosted glass plate 26. The diffraction pattern 28 of the diffraction pattern 14 is generated in the same manner that the diffraction pattern 14 of the input specimens 8 is generated.

The size of the diffraction patterns 14 and 28 is dependent upon the frequency of light applied to the input specimen 8 and the diffraction pattern 14, respectively. Various-sized input specimens are accommodated by adjusting the frequency of applied light by the use of an interference filter 30. An interference filter passes one band of light frequencies and rejects others. The band of frequencies passed is dependent upon its physical construction as explained in a book authored by Francis A. Jenkins and Harvey E. White entitled Fundamentals of Optics, 1957, published by McGraw-Hill, Library of Congress classification number QC355.J4, pages 284 and 285. FIGURE 14*s* of this reference (page 285) shows the construction of a simple interference filter. The frequency band passed by the filter is dependent upon the angle of incidence of the applied light. In the device of FIGURE 1, this angle is adjustable to accommodate a range of input specimen sizes. The interference filter 30 may be oscillated mechanically to cause the diffraction pattern to fluctuate in size and provide automatic specimen-size compensation. Similarly, a servo system could be used to automatically control the position of the interference filter to that which could provide optimum identification.

In order to simultaneously compare the diffraction pattern 28 with ten reference diffraction patterns, as is required for identification of Arabic numerals, a plate 32 containing ten lenses 34 is used to direct the pattern 28 toward ten reference diffraction pattern masks mounted on a plate 36. The masks themselves are not visible in the figure. These masks are relatively opaque with relatively transparent portions, similar to those shown in FIGURE 5, as are required with transparent input patterns on opaque backgrounds. Distance $f_5$ equals the focal length of lenses 34. Distance $d_3$, the positions and the angles of tilt of lenses 34, distance $f_5$, and the positions of the diffraction masks on the plate 36 are dependent and the device is constructed to cause the diffraction pattern 28 to be superimposed upon the reference diffraction patterns. An alternative method of compensating for various input specimen 8 sizes consists in making these distances, angles, and positions adjustable. The light passing through the reference masks is directed through normalization masks on a plate 38 (to be discussed below with respect to FIGURES 3 and 4 in Topic 3) to a bank of photoelectric cells containing ten cells 40. Each cell provides an output voltage on a lead 42 proportional to the total intensity of light impinging upon it. A maximum signal indicator circuit 44 provides a signal on one of ten output leads 46 to identify the specimen 8. The circuit 44 is described in detail hereafter in connection with FIGURES 23 and 24 in Topic 5. As will be discussed with respect to FIGURE 23, a reject output lead 48 provides an indication if the specimen does not closely match any of the reference patterns.

Serial comparison may be used instead of simultaneous (parallel) comparison by successively comparing the diffraction pattern of the diffraction pattern of the specimen with reference diffraction patterns. Alternatively several photoelectric cells may be placed at selected positions behind the frosted glass plate 26. In this embodiment, the intensity of light at these selected positions is compared to reference intensities to identify the specimen.

(2) *Second optical embodiment*

A second optical embodiment of a specimen identification device uses the autocorrelation function generator shown in FIGURE 2 in place of part of the apparatus of FIGURE 1. The autocorrelation generator shown in FIGURE 2 is described in an article by Leslie S. G. Kovasznay and Ali Arman published in the Review of Scientific Instruments, vol. 28, number 10, October 1957, pages 793–797. In FIGURE 2, a polychromatic (incoherent) source of light 50 is directed toward a half-silvered mirror 52 which reflects the light through a collimating lens 54 toward a transparency 56, containing a specimen designated by the reference numeral 58. The transparency may be relatively transparent with a relatively opaque specimen or relatively opaque with a relatively transparent specimen. The latter was used to obtain the photographs in FIGURE 5. A mirror 60 is located behind the transparency 56. Distance $d_1$ is not critical; distance $d_2$ determines the size of the autocorrelation pattern to be developed and is made adjustable to accommodate various-sized specimens. The light reflected by the mirror 60 is passed back through the transparency 56 and the lens 54 toward the half-silvered mirror 52. The light that passes through the mirror forms the autocorrelation pattern 62 on a frosted glass plate 64. The lens is separated from the frosted glass plate by a distance $f_1$ which is equal to the focal length of the lens.

This embodiment of the specimen identification device uses the bank of lenses 32, reference masks 36, normalization masks 38, bank of photoelectric cells 40, and maximum signal indicator 44 of FIGURE 1 in conjunction with the apparatus in FIGURE 2 to provide an indication of the specimens in the manner described in Topic 1. The frosted glass plate 64 (FIGURE 2) replaces the frosted glass plate 26 (FIGURE 1) and all apparatus before the bank of lenses 32 in FIGURE 1 are not used in this embodiment.

Figure 5:
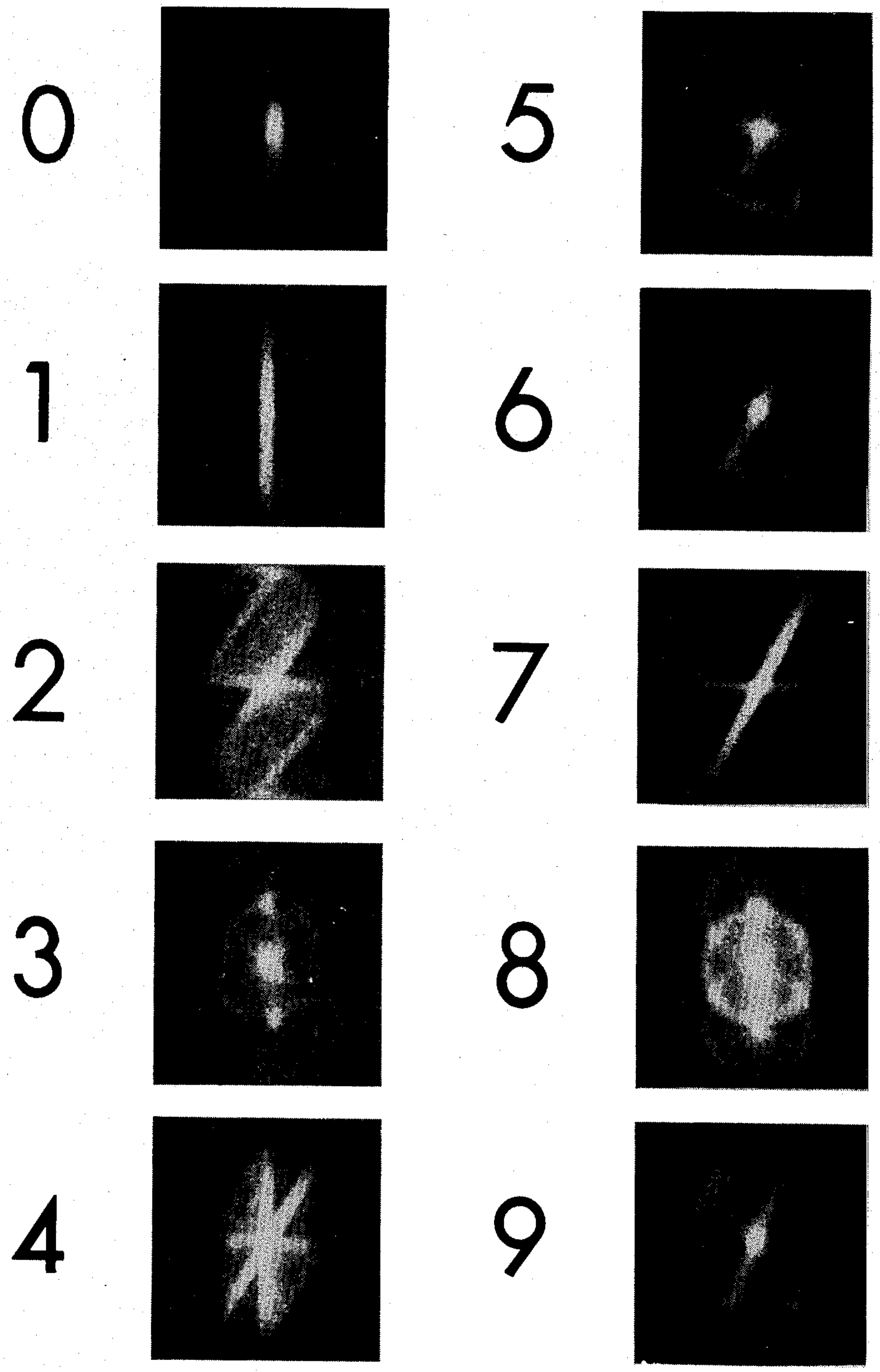
FIGURE 5 is a photograph of the autocorrelation patterns generated by the device of FIGURE 2.

The photographs in FIGURE 5 were obtained using this embodiment and indicate the patterns that are observed by looking at the frosted glass plate 62 (FIGURE 2) from the right. Positive transparencies of these photographs are used as the reference masks on plate 36 (FIGURE 1) for this embodiment. Similar photographs were obtained from the embodiment described in FIGURE 1.

As can be seen in the photographs in FIGURE 5 the autocorrelation patterns obtained for an input specimen "6" and an input specimen "9" are identical if the two input specimens are 180° rotational images of each other. This problem is obviated by using input specimens that are not rotated images of each other (such as utilizing a "9" without the lower curved portion).

(3) *Normalization of optical embodiments*

Normalization of the optical embodiments is required to insure that each ideal input pattern causes more light to impinge upon its corresponding photoelectric cell than is caused by noncorresponding input patterns. Normalization is accomplished by the use of uniformly semitransparent (gray) masks located between each photoelectric cell and its corresponding diffraction mask.

Figure 4:
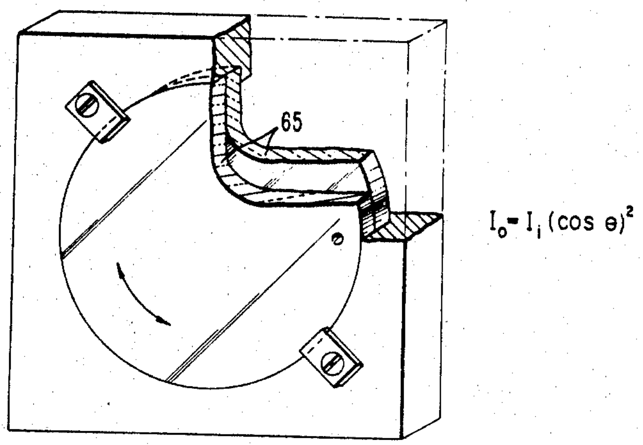
FIGURE 4 is a diagram showing the construction of a variable-opacity element usable in the devices of FIGURES 1 and 2.

The correct opacity for each normalization mask can easily be achieved by using variable-opacity elements and ideal input patterns. FIGURE 3 shows the apparatus used to determine the opacity of the normalization masks which are placed in the apparatus of FIGURE 1. One simple variable-opacity device as shown in FIGURE 4, consists of two polarized sheets 65 mounted for relative rotation. As one sheet is rotated with respect to the other, the intensity of light passing through the sheets is varied. The intensity of light passing through the sheets ($E_o$) equals the input light intensity ($E_i$) multiplied by $(\cos \theta)^2$, where $\theta$ equal the angle between the planes of polarization of the sheets.

In FIGURE 3, a monochromatic point-source of light 66 is partially reflected by a half-silvered mirror 68 through a lens toward a transparency 72 containing an unnormalized autocorrelation pattern 74. The unnormalized autocorrelation pattern transparency 72 is obtained by photographing the pattern on the frosted glass plate 26 in FIGURE 1 or the frosted glass plate 64 in FIGURE 2, depending upon the optical embodiment used. The light passing through the transparency 72 is reflected by a mirror 76 back through the transparency 72, lens 70, and half-silvered mirror 68, to a frosted glass plate 78. A photoelectric cell 80 is used to measure the intensity of light impinging uopn the frosted glass plate. Distances $d_1$ and $d_2$ are not critical; distance $f_1$ equals the focal length of the lens 70. Distance $a$ is less than distance $f_1$, and the distance between the light source 66 and mirror 68 is such that the total distance traveled by the light from the source to the lens equals the focal length of the lens. In a similar manner, unnormalized autocorrelation transparencies of each ideal reference pattern are used and the photoelectric cell 80 current is measured. A variable-opacity normalization mask 82 is then placed between the transparency 72 and the mirror 76.

The mask is adjusted to minimum opacity and the autocorrelation transparency 72 producing the least photoelectric cell 80 current in the preceding procedure is placed in the apparatus. The photoelectric cell current is again measured and recorded for subsequent comparison. The current must be measured at this step in the procedure as the mask 82, even though adjusted to minimum opacity, may have some opacity. The mask is removed from the apparatus in FIGURE 3 and placed on the plate 38 in FIGURE 1 at the location corresponding to the input pattern that produced the autocorrelation transparency 72 used in this step. This procedure is then repeated, using the unnormalized autocorrelation transparencies 72 for the remaining ideal input patterns and normalization masks 82, adjusting each mask to provide photoelectric cell 80 current equal to the current previously recorded. The masks are then placed at the appropriate location on the plate 38 (FIGURE 1).

(4) *Electronic symbols and circuits*

The schematic diagrams include several symbols for circuits (such as flip-flops, "and" gates, etc.) and functional blocks (such as registers, multipliers, etc.) which are explained in detail with respect to FIGURES 6 through 22.

FIGURES 6 through 13 show the basic digital symbols used in the schematic diagrams. Two binary conditions labelled "1" and "0," where "1" indicates the presence of a signal and "0" indicates the lack of a signal. R. K. Richards, Digital Computer Components and Circuits, 1957, published by Van Nostrand, provides a basic introduction to digital circuits and schematic diagrams of circuits that could be used in this invention.

Figure 6:
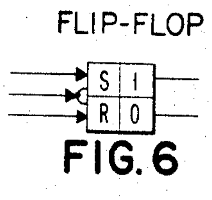

FIGURE 6 shows a basic bistable circuit, which is referred to as a flip-flop. The flip-flop is set by applying a "1" signal to the set (S) input. This provides a "1" signal at its "1" output and a "0" signal at its "0" output. This circuit is reset by applying a "1" signal to the reset (R) input, thus providing a "0" signal at the "1" output and a "1" signal at the "0" output. There is no effect on the circuit if an S input is applied when a circuit is already set, or if an R input is applied when previously reset. The third input is called a "complement" input and operates to reverse the condition of the circuit when a "1" signal is applied. If the circuit were set before the application of a complement signal, it would be reset by the signal. Similarly, if the circuit were reset before the application of this signal, it would be set by the signal.

Figure 7:
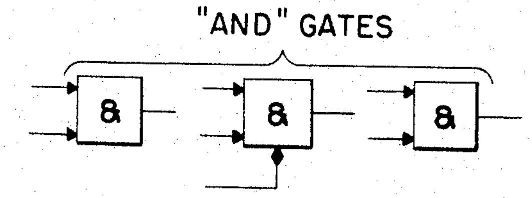
Figure 8:
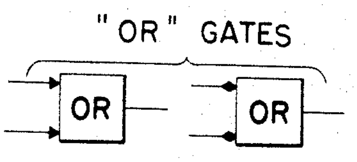

An "and" gate, as shown in FIGURE 7, provides a "1" output if all inputs received "1" signals at the same time. Three types of "and" gates are shown. An "or" gate, as shown in the two symbols in FIGURE 8, provides a "1" output if any "1" input is present. In all other cases, both the "and" gate and the "or" gate provides a "0" output.

Figure 9:
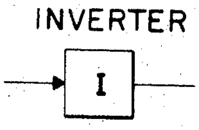

An inverter, as shown in FIGURE 9, reverses the input. If a "1" is applied, a "0" is developed as an output; if a "0" is applied, a "1" is developed.

Figure 10:
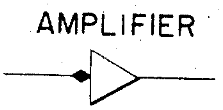

FIGURE 10 shows a symbol for a conventional amplifier.

Figure 11:
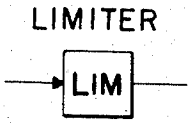

FIGURE 11 shows the symbol for a limiter. This circuit is shown in greater detail and described in conjunction with the schematic diagram in FIGURE 24.

Figure 12:
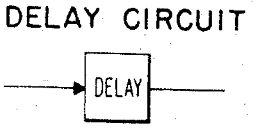

A delay circuit is shown in FIGURE 12. Signals applied to this circuit are passed after a period of time without being affected in shape or amplitude.

Figure 13:
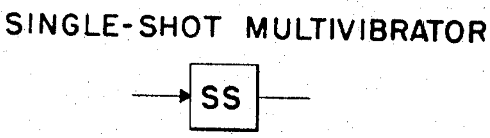

FIGURE 13 shows the symbol for a single-shot multivibrator. This circuit generates a rectangular gate output when a "1" signal is applied at its input. The output gate has an amplitude and polarity of a "1" signal and a duration dependent upon the circuit constants.

The input leads to the digital circuits are terminated in either an arrow or a diamond. An arrow indicates that either a pulse or the leading edge of a gate signal is required. A diamond indicates that a gate signal is required—for example, when used on connection with "and" gate, the diamond indicates the input to be a conditioning gate signal.

Figure 14:
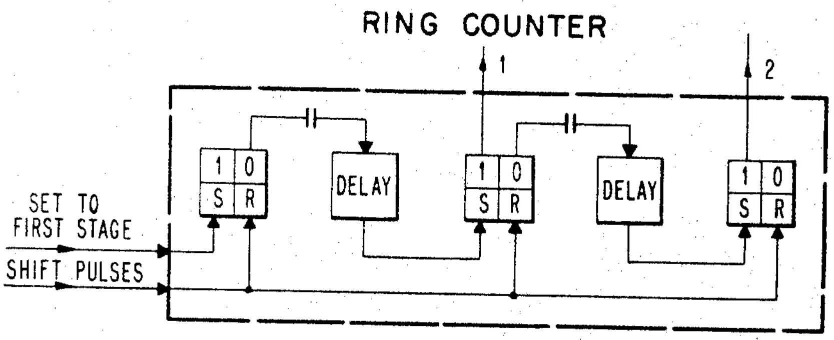

A ring counter is shown in FIGURE 14. Only one flip-flop of this counter is set at any time. At each application of a shift-pulse, the flip-flop previously set is reset and, after a delay, the adjacent, higher-order, flip-flop is set. An additional input is provided to set the lowest order flip-flop before the application of shift pulses. A more detailed description of the operation of a ring counter is found in a book authored by R. K. Richards entitled Arithmetic Operations in Digital Computers, 1955, published by Van Nostrand, Library of Congress Classification QA76.R5, on pages 205–208.

Figure 15:
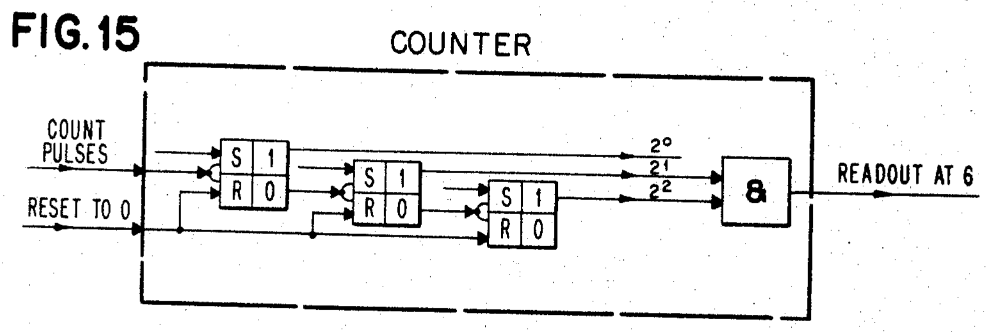

FIGURE 15 shows a series of flip-flop circuits that are conected to form a counter. Count pulses are serially applied to the complement input of the lowest order flip-flop. The counter may be reset to 0 by the application of "1" signals to all R inputs, providing a "0" signal at each flip-flop "1" output. The first count pulse applied to the complement input sets the lowest-order flip-flop, providing a "1" at its output. Since the "0" output of this flip-flop is transferred from a "1" signal to a "0" signal, there is no effect on the adjacent flip-flop. The second applied count count pulse resets the lowest-order flip-flop, providing a "0" signal at its "1" output lead and a "1" signal to the complement input of the adjacent flip-flop, transferring its condition. At this time, the $2^0$ and the $2^2$ output leads contain "0" signals and the $2^1$ output lead contains a "1" signal, indicating a total count 010, which is the binary representation of the decimal digit 2. As successive count pulses are applied, the output total increases until a total of 111 is obtained (after the 7th input pulse). The next (8th) count pulse applied causes an output total of 000 and succeeding pulses cause a repetition of the preceding operation. The counter need not be originally set to 000, but may be reset to any other number by applying "1" signals to the appropriate S and R inputs. When it is desired to provide a counter read-out signal for a particular count, an "and" gate is connected to the appropriate flip-flop outputs, depending upon the read-out count desired. In FIGURE 15, a read-out of 6 is indicated; thus the $2^1$ and $2^2$ inputs are applied to the "and" gate. This causes an output signal to be generated when the counter stores a count of either 6 or 7, as in those two cases the $2^1$ and $2^2$ leads contain "1" signals. When it is desired that the counter read out at 6 only, the $2^0$ signal is inverted and applied to the "and" gate. In this case the "and" gate has "1" signals applied to it at a count of 6 only because the $2^0$ signal is a "0" at this time, which after inversion provides the required "1" signal to operate the "and" gate. This could be accomplished without the use of an inverter if the third input to the "and" gate were taken from the "0" output of the lowest-order flip-flop.

Figure 16:
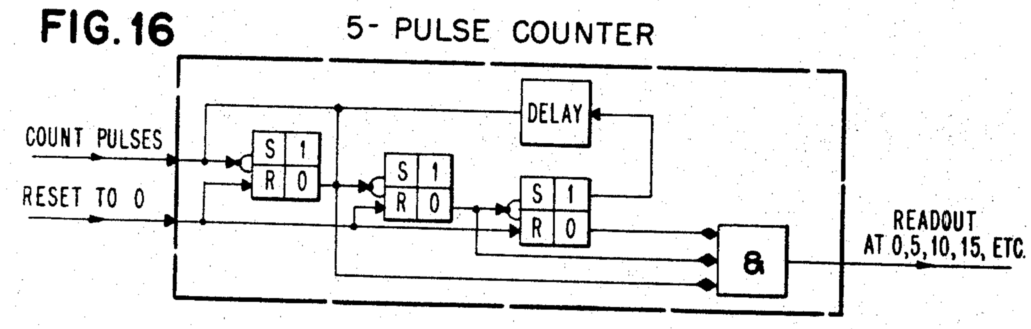

Referring next to FIGURE 16, there is shown a 5-pulse counter which provides an output for every fifth input count pulse. The "and" gate in this counter has signals applied to it from the "0" outputs of each of the flip-flops, thus the "and" gate provides an output signal when all flip-flops are reset. A reset to "0" signal is applied to the counter to reset all flip-flops. As count pulses are applied, the counter operates in a manner similar to the counter of FIGURE 15, except that, at a count of 4, a signal is delayed and fed back to the complement input of the 2 lower-order flip-flops. Thus, the fourth count pulse which initially resets the two lower-order flip-flops and sets the highest-order flip-flop, causes a signal to be fed back to the two lower-order flip-flops, setting them. The fifth count pulse applied to the circuit of FIGURE 16 causes all flip-flops to be reset which provides an output from the "and" gate. In a similar manner, the tenth, fifteenth, etc., pulses applied to this counter cause outputs from the "and" gate.

Figure 17:
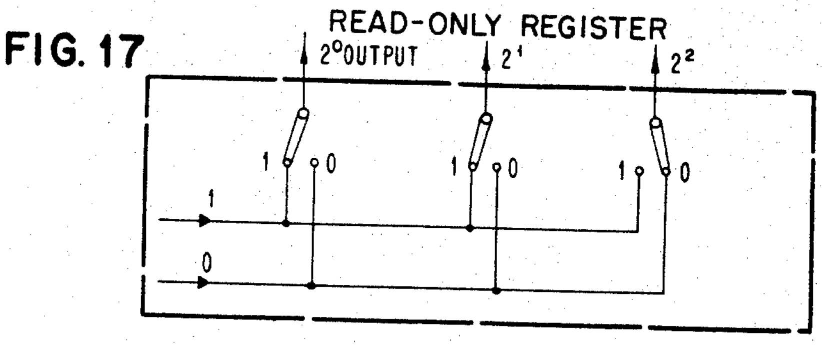

In FIGURE 17 there is shown a read-only register which provides "1" outputs on various leads dependent upon the setting of switches. The register (as shown) stores the binary number 011.

Figure 18:
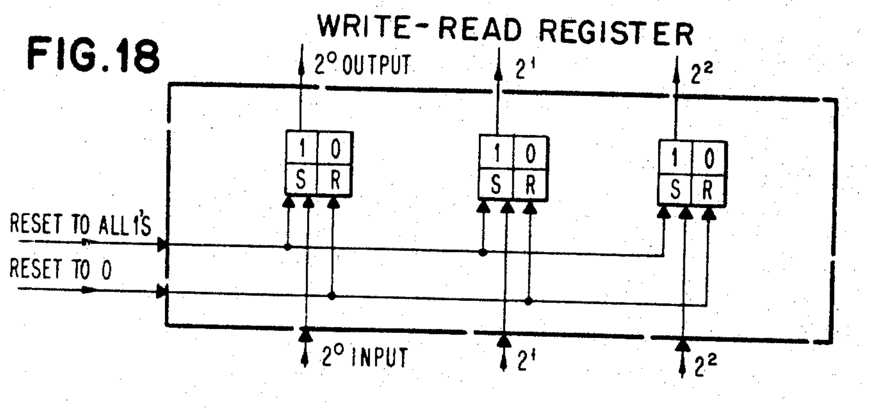

FIGURE 18 shows a write-read register. This register is reset to "0" by the application of a pulse to the flip-flop reset inputs; reset to all "1's" by the application of a pulse to all flip-flop set inputs; or reset to any other number by the application of pulses to the appropriate set and reset inputs of the flip-flops. A number is written into the register by the parallel application of pulses on the appropriate signal input leads. For example, if it were desired to write the number 101 into the register, the register would be previously reset to "0", and then a "1" signal would be applied on the $2^2$ and $2^0$ inputs. A "0" signal would be applied on the $2^1$ input. The register output, taken from the "1" outputs of the flip-flops, indicates the binary number stored in the register.

Figures 19, 20:
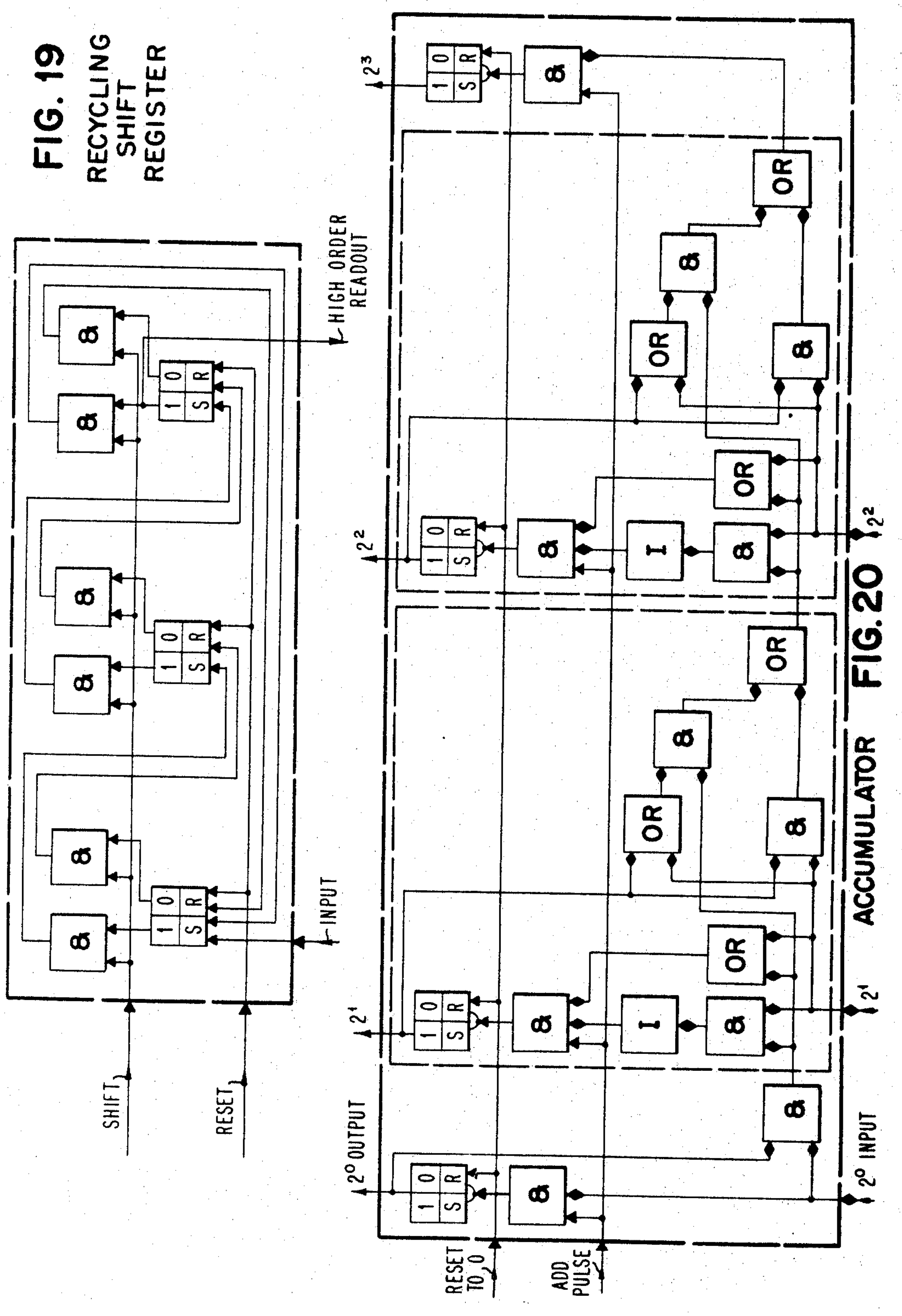

A recycling shift register is shown in FIGURE 19. This register is comprised of a group of shift register "sections" in tandem. The previously-cited R. K. Richard's text entitled Arithmetic Operations in Digital Computers contains an explanation of these and other shift register sections on pages 144–148. A reset input is applied to each flip-flop in the register. The data input to the shift register is applied serially to the set input of the lowest-order flip-flop. Shift pulses are applied to the shift register in between each input data bit. These pulses condition the "and" gates which cause the data stored in each flip-flop to be transferred to the next highest order flip-flop. Since this is a recycling shift register, the output of the highest output order flip-flop is fed back to the lowest-order flip-flop. In this manner, the data that is placed in the shift resister is recycled by the application of subsequent shift pulses. A high order read-out is provided to indicate the highest order bit in the register. In this manner, data stored in the register can be read out serially merely by applying a succession of shift pulses.

An accumulator is shown in FIGURE 20. This accumulator is of the type shown on FIGURE 4–22 (page 110) and described in the previously-cited R. K. Richard's text entitled Arithmetic Operation in Digital Computers. A reset input is applied to each flip-flop in the accumulator. The binary word (parallel) to be accumulated and an "add" pulse are applied simultaneously and the binary word is added to the previously stored sum. This circuit is explained in detail in the reference.

The substracter shown on FIGURE 21 is similar to the subtracter shown and described in the previously-cited R. K. Richard's text entitled Arithmetic Operation in Digital Computers. The half subtracters shown on FIGURE 21 follow the binary subtraction Table 4–III, on page 115 of the reference. The half adder shown on FIGURE 21 is identical to the circuit in the reference in FIGURE 4–3 (c) on page 86. FIGURE 21 shows only two stages of the subtracter in detail. The third stage is shown as a block which is presumed to include all the circuits in the second stage. Since the binary subtracter output indication for negative differences is in the complement form, the borrow from the highest order full subtracter indicates the sign of the difference—a "1" indicates a negative difference, a "0" indicates a positive difference.

FIGURE 22 shows an add-"1" register. This register may be reset to 0 by the application of a pulse to the reset input of each flip-flop. A number to be stored in the register is applied in parallel to the set inputs of the flip-flops in a manner similar to the write-read register in FIGURE 18. The add "1" register increases its total by "1" when a signal is applied on the add "1" input. In this respect, the add-1 register operates in a manner similar to the counter in FIGURE 15, as the "0" output of each flip-flop is applied as the "complement" input of the adjacent flip-flop.

A multiplier that is suitable to be used in the schematic diagrams is shown in FIGURE 5–1 (page 139) and explained in the previously-cited R. K. Richard's text entitled Arithmetic Operation in Digital Computers.

(5) *Maximum signal indicators for optical embodiments*

The optical embodiments of FIGURES 1 and 2 include a maximum signal indicator for returning the largest of the applied analog voltages. A typical maximum signal indicator is shown in FIGURE 23. DC voltage analog inputs are applied on leads 42 from the bank of photoelectric cells 40 in FIGURE 1. The purpose of the maximum signal indicator is to produce a signal on the lead 46 that corresponds to the lead 42 having the highest signal level. Reject output 48 contains a signal when there is an insufficient difference in signal levels between the largest and second largest signals on leads 42.

A group of difference amplifiers 100 perform subtraction of the voltage developed on each input from the voltage developed on each other input. A signal is present on lead 102 if $E_0-E_1$ is positive. Similarly, a signal is present on lead 104 if $E_0-E_2$ is positive. A group of inverters 106 and designated by blocks labelled I provides outputs indicative of the reverse of the difference amplifier subtractions. Therefore, no difference amplifier is required for $E_1-E_0$, $E_2-E_0$, etc. This halves the number of difference amplifiers required (compare to the number needed if all subtractions were performed by difference amplifiers and no inverters were used.)

A limiting circuit 108 is connected to the output of each difference amplifier 100. FIGURE 24 is a circuit diagram of a limiter that may be used in the circuit of FIGURE 23. Batteries 110 determines the voltage levels at which diodes 112 conduct to limit the input signal. The battery voltages are equal and depend upon the signal input level required to operate the "and" gates 114 to which the limiter outputs are applied. The "and" gates 114 (FIGURE 3) may be formulated by a "Christmas tree" arrangement of any well-known variety of two-input "and" gates or a single multiple-input (nine-input) "and" gate, as for example, the type shown in FIGURES 13–8 of Jacob Millman and Herbert Taub, Pulse and Digital Circuits, 1956, published by McGraw Hill. Nine-lead cables are shown on FIGURE 23, rather than nine separate leads, to simplify the drawing. Each limiter 108 output is applied directly to one "and" gate 114 and through an inverter to a second "and" gate, thereby halving the number of difference amplifiers required.

If any limiter 108 output is less than the "and" gate 114 reference voltage (the voltage which all inputs must equal or exceed to cause the gate to operate), the output of the "and" gate is blocked. This indicates that the autocorrelation pattern of the reference pattern is not similar to the autocorrelation pattern of the specimen to be identified. The "and" gate reference voltage determines the amplitude of the voltages from the difference amplifiers and limiters required for operation. Therefore, this voltage determines the sensitivity of the pattern recognition system as it determines the minimum amount of difference in correlation between the closest and next closest match that will provide "and" gate operation and thus an identification indication. The use of limiters preceding the "and" gate provides more stable "and" gate operation. Since the limiter battery voltages are equal to the reference voltage of the "and" gates, all signals are limited to the level necessary to operate the "and" gates.

A reject output signal is developed on lead 48 when no reference pattern is recognized as comparing to the input specimen. This is accomplished by applying the "and" gate outputs 46 through individual inverters 116 to an "and" gate 118. If any output 46 is present, the associated inverter 52 produces an inhibit signal to "and" gate 118 inhibiting the reject output 48.

The maximum signal indicator described above, accepts analog input signals, such as the outputs of the photocells in the optical embodiment and generates digital outputs indicative of the largest applied signal.

(6) *Manual generation of autocorrelation functions*

In order to provide a clear illustration of the principles of the invention which are embodied in the accompanying detailed descriptions, the manual generation of autocorrelation functions and some of the theory associated therewith will be described below.

The autocorrelation function is a measure of the correlation of a function with itself and is generated by comparing the specimen to be autocorrelated with itself, shifted in all directions and distances.

FIGURES 25 through 32 illustrate a method of generating the autocorrelation function in FIGURE 33 for a typical pattern "3." In the following description, the patterns are comprised of 15 discrete areas on a 3×5 matrix for simplicity of arithmetic. In practice, this invention is designed to be used to identify specimens comprising many discrete areas on a large matrix.

The pattern "3" formed by slant-left lines is common to FIGURES 25 through 32; the pattern formed by slant-right lines is shifted to various positions in the figures. FIGURE 25 illustrates the "0-shift" pattern, and hence, the slant-left and slant-right patterns are superimposed. If the discrete areas of the matrix are considered to have $x$ and $y$ coordinates, as shown in FIGURE 25, $f(x, y)$ is "1" for ($x=3$, $y=9$); ($x=4$, $y=9$); ($x=5$, $y=8$); ($x=4$, $y=7$); ($x=5$, $y=6$); ($x=4$, $y=5$); and ($x=3$, $y=5$). For all other values of $x$ and $y$, $f(x, y)=0$. The autocorrelation function $D(x', y')$ is determined by the equation:

$$D(x', y')=\sum_{x,y} f(x, y)f(x+x', y+y')$$

In the "0-shift" condition (FIGURE 25), $x'=y'=0$ and the sum is merely a count of the number of areas that are filled by the pattern, as the product $f(x, y)\cdot f(x+0, y+0)=1$ whenever $f(x, y)=1$. This sum is "7" for the pattern in FIGURE 25, and it is placed in the "0-shift" position 151 in the table in FIGURE 33. FIGURE 26 illustrates the conditions present for a shift of one unit to the right, designated as ($x'=1$, $y'=0$), which causes a "2" to be placed at the corresponding position 153 of the table in FIGURE 33 as there are two coincident areas on the matrix. Position 153 is displaced one unit to the right of position 151 to correspond to a shift of one unit to the right of the pattern in FIGURE 26. A "2" is also placed in position 155 of the table as a shift to the left of one unit ($x'=-1$, $y'=0$) obviously produces the same result as a shift to the right of one unit ($x'=1$, $y'=0$) FIGURE 27 illustrates the conditions present for ($x'=2$, $y'=0$) which provides a "0" at location 157 on FIGURE 33 (and also position 159), corresponding to ($x'=-2$, $y'=0$). In a similar manner, positions 161 and 163 of the table are filled with "1's" as determined by FIGURE 28. FIGURES 29 through 32 illustrate the conditions present for several other combinations of $x'$ and $y'$. Using this procedure, the entire autocorrelations table of FIGURE 33 may be filled in for the typical pattern "3."

FIGURE 34 shows ten arabic numeral patterns on 3×5 matrices; their autocorrelation functions; their normalized autocorrelation functions; and their normalized "second-difference" autocorrelation functions. All functions are shown in abbreviated form, omitting the redundant "reflected' 'portions.

The normalized function $Z_{R_n}(x', y')$ of the reference R$n$ is generated using the formula:

$$Z_{R_n}(x', y')=\frac{D_{R_n}(x', y')}{\left[\sum_{x', y'} D_{R_n}^2(x', y')\right]^{1/2}}$$

A calculation for the pattern "1" provides a divisor of $$(1^2+2^2+3^2+4^2+5^2+4^2+3^2+2^2+1^2)^{1/2}=85^{1/2}=9.22$$

which is divided into 1, 2, 3, 4 and 5 to obtain 0.1085, 0.2169, 0.3254, 0.4339 and 0.5423, respectively. The division must be computed using the redundant numbers that are not shown on FIGURE 34 as well as the numbers shown.

One of the "discriminating" functions, the normalized "second-difference" functimon $Y_{R_n}(x', y')$ of the reference R is obtained using the formula::

$$Y_{R_n}(x', y')=\frac{E_{R_n}(x', y')}{\left[\sum_{x'', y''} F_{R_n}^2(x'', y'')\right]^{1/2}}$$

where:

$$E_{Rn}(x'', y'')=\sum_{x', y'} L_{x'', y''}(x', y')\cdot D_{Rn}(x', y')$$

$$F_{Rn}(x'', y'')=\sum_{x', y'} M_{x'', y''}(x', y')\cdot D_{Rn}(x', y')$$

| | | | | | | | | | | | | | |
|---|---|---|---|---|---|---|---|---|---|---|---|---|---|
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 1 | 0 | 0 | 0 | 0 | 0 | 0 |
| | 0 | 0 | 0 | 0 | 0 | 2 | −8 | 2 | 0 | 0 | 0 | 0 | 0 |
| $L_{0,0}(x', y')=$ | 0 | 0 | 0 | 0 | 1 | −8 | 20 | −8 | 1 | 0 | 0 | 0 | 0 |
| | 0 | 0 | 0 | 0 | 0 | 2 | −8 | 2 | 0 | 0 | 0 | 0 | 0 |
| | 0 | 0 | 0 | 0 | 0 | 0 | 7 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 9 | 9 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | −1 | 0 | 0 | 0 | 0 | 0 | 0 |
| $M_{0,0}(x', y')=$ | 0 | 0 | 0 | 0 | 0 | −1 | 4 | −1 | 0 | 0 | 0 | 0 | 0 |
| | 0 | 0 | 0 | 0 | 0 | 0 | −1 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 9 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |

The subscripts for L and M indicate the position on the 13×17 matrix that the nonzero portion fills. For example, subscripts (0,0) indicate the nonzero portion of the matrix is centered as shown above whereas subscripts (2, −3) would indicate that all nonzero elements are shifted up two positions and to the left three positions. The L matrix is the autocorrelation function of the M matrix.

A sample calculation to obtain the 0.297 at position 175 of the normalized "second-difference" autocorrelation function for the pattern "1" follows. The autocorrelation function is centered on a 13×17 matrix as follows:

| | | | | | | | | | | | | | |
|---|---|---|---|---|---|---|---|---|---|---|---|---|---|
| | 0 | 0 | 0 | 0 | 0 | 0 | 0 | 0 | 0 | 0 | 0 | 0 | 0 |
| | 0 | 5 | 0 | 0 | 0 | | | 0 | | | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 1 | 0 | 0 | 0 | 0 | 0 | 0 |
| | 0 | 0 | 0 | 0 | 0 | 0 | 2 | 0 | 0 | 0 | 0 | 0 | 0 |
| | 0 | 0 | 0 | 0 | 0 | 0 | 3 | 0 | 0 | 0 | 0 | 0 | 0 |
| | 0 | 0 | 0 | 0 | 0 | 0 | 4 | 0 | 0 | 0 | 0 | 0 | 0 |
| $D_{R1}(x', y')=$ | 0 | 0 | 0 | 0 | 0 | 0 | 5 | 0 | 0 | 0 | 0 | 0 | 0 |
| | 0 | 0 | 0 | 0 | 0 | 0 | 4 | 0 | 0 | 0 | 0 | 0 | 0 |
| | 0 | 0 | 0 | 0 | 0 | 0 | 3 | 0 | 0 | 0 | 0 | 0 | 0 |
| | 0 | 0 | 0 | 0 | 0 | 0 | 2 | 0 | 0 | 0 | 0 | 0 | 0 |
| | 0 | 0 | 0 | 0 | 0 | 0 | 1 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |

The denominator $$\left[\sum_{x'', y''} F_{R1}^2(x'', y'')\right]^{1/2}$$

is determined as follows:

$F_{R1}(0, 0)$ equals $(4)(5)+(-1)(4)=+(-1)(4)12$

All products other than $$D_{R1}(0, 0)\cdot L_{0,0}(0, 0),\ D_{R1}(0, 1)\cdot L_{0,0}(0, 1)$$

and $$D_{R1}(0, -1)\cdot L_{0,0}(0, -1 \text{ equal } 0$$

Similarly, $$F_{R1}(0, 1)=F_{R1}(0, -1)=(4)(4)+(-1)(3)+(-1)(5)=8$$

$$F_{R1}(0, 2)=F_{R1}(0, -2)=(4)(3)+(-1)(2)+(-1)(4)=6$$

$$F_{R1}(0, 3)=F_{R1}(0, -3)=4(2)+(-1)(1)+(-1)(3)=4$$

$$F_{R1}(0, 4)=F_{R1}(0, -4)=4(1)-1(2)=2$$

$$F_{R1}(0, 5)=F_{R1}(0, -5)=-1(1)=-1$$

$$F_{R1}(1, 0)=F_{R1}(-1, 0)=(-1)(5)=-5$$

$$F_{R1}(1, 2)=F_{R1}(1, 2)=F_{R1}(-1, 2)=F_{R1}(-1, -2)=(-1)(3)=-3$$

$$F_{R1}(1, 3)=F_{R1}(1, -3)=F_{R1}(-1, 3)=F_{R1}(-1, -3)=(-1)(2)=-2$$

$$F_{R1}(1, 4)=F_{R1}(1, -4)=F_{R1}(-1, 4)=F_{R1}(-1, -4)=(-1)(1)=-1$$

The denominator is finally determined as:

$$[12^2+2(8)^2+2(6)^2+2(3)^2+2(2)^2+2(-1)^2+2(-5)^2+4(-4)^2+4(-3)^2+4(-2)^2+4(-1)^2]^{1/2}=556^{1/2}=23.58$$

Each numerator, $E_{R1}(x'', y'')$, is obtained by multiplying $L_{x'', y''}(x', y')$ by $D_{R1}(x', y')$, point by point, and summing over $x'$, $y'$. In order to obtain the number at position 175, which corresponds to ($x'=0$, $y'=4$), the matrix $L_{0,4}(x', y')$ is multiplied point by point by $D_{R1}(x', y')$ and summed. This results in $$(20\times 1)+(-8\times 2)+(1\times 3)=7$$

The remaining products are zero.

The resulting number for position 175 of the normalized "second-difference" autocorrelation function is thus:

$$7/23.58=0.297$$

Since the L matrix is a basic 5×5 matrix surrounded by zeros and the autocorrelation function matrix is a basic 5×9 matrix surrounded by zeros, the normalized "second-difference" autocorrelation function matrix is a basic 9×13 matrix surrounded by zeros. The redundant "reflected" portions of the matrix are not shown in FIGURE 34. When the normalized "second-difference" autocorrelation function $Y_{Rn}(x', y')$ of the reference patterns R*n* are used in the specimen identification apparatus, comparison sums $S_{S, Rn}$ are developed by the formula:

$$S_{S, Rn}=\sum_{x', y'} D_S(x', y')\cdot Y_{Rn}(x', y')$$

In this case $Y_{Rn}(x', y')$ replaced $Z_{RN}(x', y')$ in the formula previously discussed. Since $D_S(x', y')$ is zero for $x'>\pm 2$ or $y'>\pm 4$, all products $D_S(x', y')\cdot Y_{Rn}(x', y')$ are zero in these cases. For this reason, only the portion of $Y_{Rn}(x', y')$ within the heavy lines (FIGURE 34) is used in the apparatus.

The use of "second-difference" functions improve discrimination due to the negative components in the M matrix. Another class of functions, the "smoothing" functions, does not improve discrimination, but improves stability of recognition of poor specimens, such as those with addition or deletions noise, those with or without serifs, etc. These functions are determined by the preceding formulas for $Y_{Rn}(x', y')$, replacing the M matrix with a matrix (S) having no negative elements and replacing the L matrix with a matrix (R) derived as the autocorrelation function of the S matrix. One of the "smoothing" functions, the "averaging" function, uses the following S matrix:

| | | | | | | | | | | | | | |
|---|---|---|---|---|---|---|---|---|---|---|---|---|---|
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 1 | 0 | 0 | 0 | 0 | 0 | 0 |
| $S_{0,0}(x', y')=$ | 0 | 0 | 0 | 0 | 0 | 1 | 1 | 1 | 0 | 0 | 0 | 0 | 0 |
| | 0 | 0 | 0 | 0 | 0 | 0 | 1 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |
| | 0 | 0 | 0 | 0 | 0 | 0 | 0 | 0 | 0 | 0 | 0 | 0 | 0 |

The autocorrelation function of the S matrix provides the following R matrix:

$$R_{0,0}(x', y')=\begin{matrix} 0&0&0&0&0&0&0&0&0&0&0&0&0\\ 0&0&0&0&0&0&0&0&0&0&0&0&0\\ 0&0&0&0&0&0&0&0&0&0&0&0&0\\ 0&0&0&0&0&0&0&0&0&0&0&0&0\\ 0&0&0&0&0&0&0&0&0&0&0&0&0\\ 0&0&0&0&0&0&0&0&0&0&0&0&0\\ 0&0&0&0&0&0&1&0&0&0&0&0&0\\ 0&0&0&0&0&2&2&2&0&0&0&0&0\\ 0&0&0&0&1&2&5&2&1&0&0&0&0\\ 0&0&0&0&0&2&2&2&0&0&0&0&0\\ 0&0&0&0&0&0&1&0&0&0&0&0&0\\ 0&0&0&0&0&0&0&0&0&0&0&0&0\\ 0&0&0&0&0&0&0&0&0&0&0&0&0\\ 0&0&0&0&0&0&0&0&0&0&0&0&0\\ 0&0&0&0&0&0&0&0&0&0&0&0&0\\ 0&0&0&0&0&0&0&0&0&0&0&0&0\\ 0&0&0&0&0&0&0&0&0&0&0&0&0 \end{matrix}$$

When identifying specimens using "averaging" functions of the autocorrelation function comparison, the $$Y_{Rn}(x', y')$$

formula is converted to the following formula for $$W_{Rn}(x', y')$$

$$W_{Rn}(x', y,)\frac{B_{Rn}(x', y')}{\left[\sum_{x'', y''} C_{Rn}^{2}(x'', y'')\right]^{1/2}}$$

where $$B_{Rn}(x'', y'')=\sum_{x', y'} R_{x'', y''}(x', y')\cdot D_{Rn}(x', y')$$

and $$C_{Rn}(x'', y'')=\sum_{x', y'} S_{x'', y''}(x', y')\cdot D_{Rn}(x', y')$$

The comparison sums $S_{S, Rn}$ are then developed by the formula:

$$S_{S, Rn}=\sum_{x', y'} D_S(x', y')\cdot W_{Rn}(x', y')$$

(7) *Identification and stability*

Autocorrelation function comparison provides accurate and stable identification of specimens.

The sums $S_{S, Rn}$ obtained using the data of FIGURE 34 and discussed above are shown in FIGURE 35 where the normalized autocorrelation function $Z_{Rn}(x', y')$ of the reference patterns are used, and in FIGURE 36 where the normalized "second-difference" autocorrelation function $Y_{Rn}(x', y')$ of the reference patterns are used. The largest sums are developed in each case when the input pattern matches the reference pattern, but when "second-difference" autocorrelation comparison is used, a larger ratio is obtained between the closest and second-closest matches.

FIGURE 37 shows the results obtained when using autocorrelation function comparison of ideal input specimens and input specimens containing deletion and addition noise with reference patterns. In this case, the patterns are divided into a larger number of discrete areas than the patterns used in the preceding description. The preceding description is simplified in this manner. In practice, the invention is used with patterns having a number of discrete areas of the order shown in FIGURE 37. The data below the patterns is the measure of similarity of the specimen to three reference patterns (A, B and R) and was obtained by further normalizing the sums $S_{S,Rn}$ obtained using normalized autocorrelation function $$Z_{Rn}(x', y')$$

comparison. Patterns A, B and R, which are similar in structure, were chosen to show the stability of autocorrelation function comparison under adverse conditions.

(8) *Electronic embodiment*

FIGURE 38 is a block diagram of an electronic embodiment of the invention. A specimen 201 on a matrix

203 is scanned by a flying-spot scanner 205. A phototube 207 develops a signal $f(x, y)$ indicative of the specimen. Any means of converting the specimen to electrical information could be used. In this case, the scanner and phototube illustrate one means of obtaining an electronic indication of the specimen.

The phototube 207 output is stored in two recycling shift registers 243 and 245. A clock 246 controls the timing of the circuits. At time "1*a*" a pulse is applied to the cycle control circuit 248 which supplies a series of cycling pulses to the shift registers 243 and 245 to sequentially shift the data in each register completely through the register and return the data to its original position. An "and" gate 255 and counter 257 develop the "zero-shift" autocorrelation function $D_S(0, 0)$, which is applied to a group of multipliers 303. At time "1*b*," a pulse is applied to appropriate "and" gates 313 to cause the normalized autocorrelation function of the references R1, R2 . . . R*n* . . . for $x'=0$, $y'=0$, designated $Z_{R1}(0, 0)$, $Z_{R2}(0, 0)$ . . . $Z_{Rn}(0, 0)$ . . . which are stored in register 299, to be applied to the appropriate multipliers 303. The products $D_S(0, 0)\cdot Z_{R1}(0, 0)$, $D_S(0, 0)\cdot Z_{R2}(0, 0)$ . . . $D_S(0, 0)\cdot Z_{Rn}(0, 0)$ . . . are developed by the multipliers and applied to a group of accumulators 327. At time "1*c*," a pulse is applied to a shift control circuit 328, which causes the data in shift register 245 to be shifted one position. The shift registers are again recycled at time "2*a*" and the counter develops an output $D_S(1, 0)$ which at time "2*b*" is multiplied by $Z_{R1}(1, 0)$, $Z_{R2}(1, 0)$ . . . $Z_{Rn}(1, 0)$ . . . to develop products $$D_S(1, 0)\cdot Z_{R1}(1, 0)$$

$D_S(1, 0)\cdot Z_{R2}(1, 0)$ . . . $D_S(1, 0)\cdot Z_{Rn}(1, 0)$. . . . These products are applied to accumulators 327 where they are added to the previously stored products. In a similar manner, the remaining products are developed and applied to the accumulators. After all products have been developed, the accumulator outputs represent $$\sum_{x', y'} D_S(x', y')\cdot Z_R(x', y')$$

for each reference R. This sum has been previously defined as $S_{S, Rn}$.

A maximum signal indicator 330 selects the largest accumulator output as an indication of the identity of the specimen or provides a "reject" indication if the ratio of the largest sum to the second largest sum is insufficient.

FIGURE 39 shows an electronic embodiment of a pattern identification device capable of identifying a 3×5 pattern 201 on a 5×9 matrix 203. The specimen 201 is serially scanned by a flying-spot scanner 205 and a phototube 207. A book authored by V. K. Zworykin and E. G. Ramberg entitled Photoelectricity and Its Application, 1949, published by John Wiley, QC715.Z8 describes a flying spot scanner and associated sweep circuits on pages 369–375.

The phototube output is presumed to be of sufficient amplitude to operate the subsequent circuitry. A photomultiplier or other suitable means of amplification is not shown as it is considered to be obvious to one skilled in the art to provide the necessary basic circuits to produce adequate signal levels. Similarly, no amplifiers are shown in any logic circuits, with the exception of circuit output drivers.

FIGURE 49 shows several waveshapes that pertain to the circuit shown in FIGURE 39. The waveshape labels correspond to similarly labelled points and leads on FIGURE 39.

A start pulse (waveshape A) initiates the operation of the pattern identification circuit. This pulse causes a single shot gate generator 209 to produce a conditioning gate on lead 211 that is one unit wide. One unit of time is defined as being the time between adjacent clock pulses (waveshape B). The first clock pulse occurring after start pulse A is thus passed through "and" gate 213 as waveshape C. This pulse serves several functions, one of which is to trigger the vertical sweep generator 204 which generates the vertical sweep (waveshape D) for the flying spot scanner 205. Since the matrix 203 is considered to have five discrete positions along each horizontal row, and nine discrete horizontal rows, the flying spot scanner sweeps horizontally nine times during each vertical sweep. Each horizontal sweep (waveshape F) is five units of time long. A five-pulse counter 215 provides a "1" output when registering a count of 0. This counter is reset to 0 by waveshape C. Another counter 217 which is also reset by waveshape C, provides a "1" output on lead 219 to "and" gate 221 when its count is lower than 8. Waveshape C triggers the first horizontal sweep for the scanner by setting counter 215 to 0, which provides a "1" output through "or" gate 223 to horizontal sweep generator 225. The fifth clock pulse B after waveshape C causes counter 215 to count past its maximum of four and the counter again registers 0, which provides a "1" output to start the second horizontal sweep (see waveshape E). In the same manner, the following horizontal sweeps are initiated. The beginning of the ninth horizontal sweep supplies the eighth pulse to counter 217 causing the counter to register 8, which terminates the conditioning gate ("1" output) for "and" gate 221. This terminates the scanner operation by causing a 0 signal on lead 219 to inhibit "and" gate 221, which removes clock pulses B from the input of counter 215.

Waveshape C also sets flip-flop 227 (through "or" gate 223) which conditions "and" gate 229. Clock pulses which are delayed one-half unit by delay 231 are also applied to "and" gate 229. The clock pulses passed by this "and" gate (waveshape G) condition "and" gate 231 to enable it to pass the video output of the phototube 207 at intervals during the sweep of the scanner. Waveshape H shows the approximate video output of the phototube for the input specimen "3."

The one-half unit delay 231 causes the phototube output to be sensed as the scanning beam is approximately at the center of each area of matrix 203. Waveshape I indicates the signal present at the output of "and" gate 231 for an input specimen "3."

A counter 233 is reset to "0" by waveshape C. This counter provides two outputs; one at a count of "44" and one at a count of "45." The 45th clock pulse passed by "and" gate 229 provides an output from counter 233 that resets flip-flop 227, thus inhibiting "and" gate 229 and preventing further passage of video by "and" gate 231. Since the counter 233 is read-out to reset flip-flop 227 at a count of "45," there are 45 intervals of time during which the flip-flop is set and "and" gate 229 is conditioned. The forty-five pulses from "and" gate 229 (waveshape G) are also applied to another "and" gate 235. The forty-fifth of these pulses is inhibited by waveshape K, which is a 1½ unit inhibit signal begun by the counter "read-out at 44" (waveshape J). The output of "and" gate 235 is delayed one-half unit by delay 237 to provide a pulse train (waveshape L) that is in phase with the clock pulses (waveshape B).

Two 45-position shift registers 243 and 245 are each reset by waveshape C. The 44 pulses in waveshape L are applied through "or" gates 247 and 249 to shift the registers 44 times. Since the shift pulses (waveshape L) are in phase with the clock pulses (waveshape B), the shifts occur between successive video pulses from "and" gate 231. Thus, one-half unit after the first video signal (from the first area of matrix 203) is passed through "and" gate 231 into the first positions of the shift registers 243 and 245, the first of the 44 shift pulses (waveshape L) shifts this data into the second order of each shift register. Another one-half unit later, the video signal corresponding to the second area of matrix 203 is placed into the lowest order of each shift register. After 44 successive shifts the 45 video representations of the discrete areas of matrix 203 are stored in each shift register.

Figure 40:
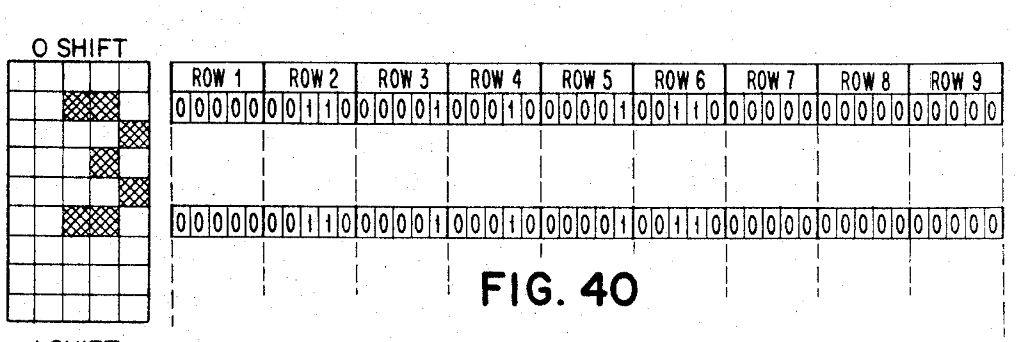
Figure 41:
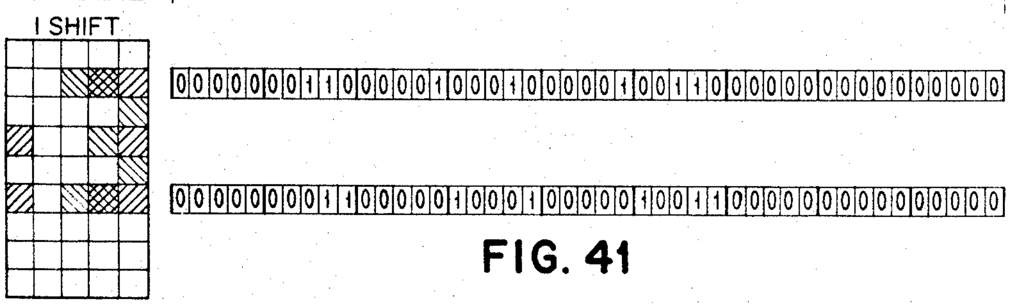
Figure 42:
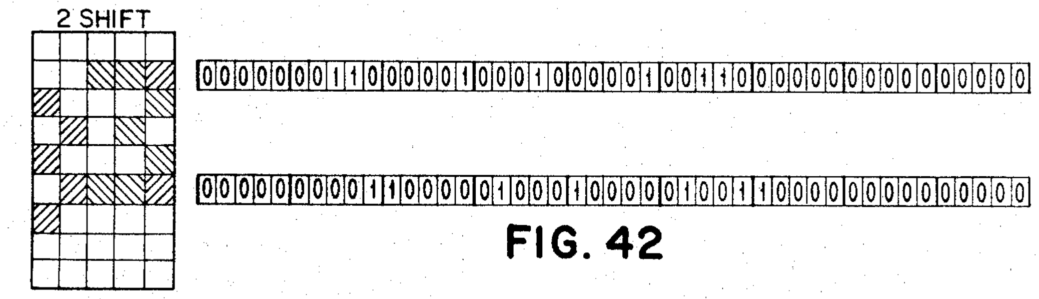
Figure 43:
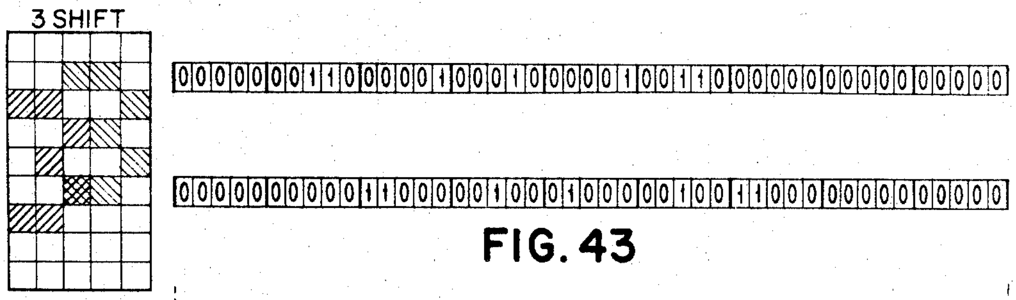
Figure 44:
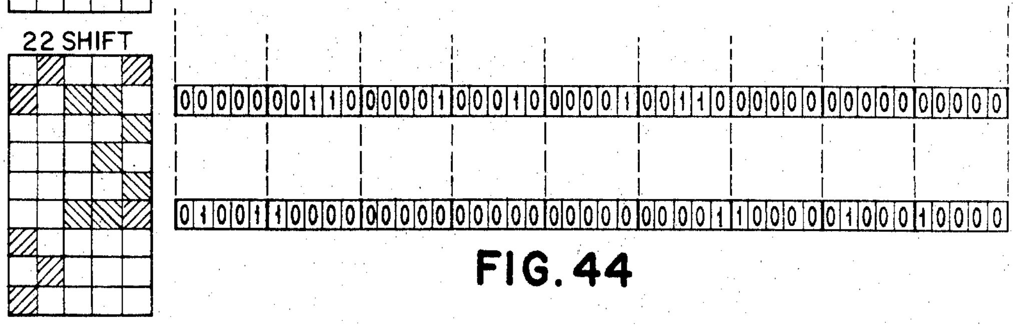

FIGURES 40–47 show the subsequent operation of the shift registers 243 and 245 and their associated circuitry in developing the autocorrelation sums. Following this paragraph will be a detailed electrical description of the operation of the shift registers. Each of FIGURES 40–47 show two 45-bit binary words indicating the bits stored in the shift registers 243 and 245 as the autocorrelation function is generated. The upper binary word is the same in all figures and represents the data in shifting register 243 corresponding to an uncentered input specimen "3" indicated on the matrices in FIGURES 40–47 by "slant-left" lines. The lower binary word indicates the data in shift register 245. This word is obtained by shifting the data in the upper binary word by the amount indicated. The shift registers described are the "closed" type, where bits in the last position of the register are shifted into the first position. The "slant-right" lines in the matrices show the positions of the shifted specimen "3" corresponding to the lower binary word. The bits in the upper word are compared with the bits in the lower word and a count made of the number of coincident bits. This count provides the data for the autocorrelation table of FIGURE 48. FIGURE 40 shows the condition of the shift registers during the initial operation, after being filled with the binary data pertaining to the input specimen "3" (as described in the last paragraph). There are seven coincidence bits, providing the "7" at the center (position 0) of FIGURE 48. FIGURE 41 shows the condition of the shift registers during the second operation—the lower binary word is shifted one position. This corresponds to shifting the input specimen to the right one unit. Note the shifted specimen (slant-right lines) on the matrix is partially on the left side of the matrix. There are now two coincident bits (bit number 4 in row 2 and bit number 4 in row 6), providing the "2" at position 1 of FIGURE 48. FIGURE 42 shows the conditions present after two shifts, indicating 0 coincident bits, providing the "0" at position "2" of FIGURE 48. As the shifting is continued (after three shifts) the shifted specimen takes the shape of the "3" on the left side of the matrix, one row lower than the unshifted (short-left lines on the matrix) specimen (FIGURE 43). After three shifts, there is one coincident bit (bit number 3 of row 6), providing the "1" at position 3 of FIGURE 48. Continued shifting provides the remainder of the data for the table in FIGURE 48. FIGURE 44 shows the conditions present after twenty-two shifts. The lower word in FIGURE 44 shows three bits (number 2 and 5 of row 1 and number 1 of row 2) that have entered the left end of the word from the right. The shifted specimen (slant-right lines) has begun to enter at the top of the matrix, corresponding to bits entering the left end of the lower word. There are no coincident bits after twenty-two shifts, providing a "0" at position 22 of the table in FIGURE 48 (corresponding to shifting the specimen to the right two units and down four units). FIGURE 45 shows the conditions that would be present after twenty-three shifts, providing 0 coincident bits. This corresponds to a shift to the left two units and down five units, which is comparable to the shifting to the left two unis and up four units, because the matrix has nine rows. On the matrix of FIGURE 45, bit 246 is shifted into bit 248 (left two units and down five units), and bit 250 is shifted into bit 252 (left two units and up four units). The choice of left two units and up four units was made to enable the data to be entered into the table of FIGURE 48 at position 23. The 23rd and all subsequent shifts provide data for the upper portion of the table of FIGURE 48. Due to the symmetry of the table, this data is redundant. FIGURE 44 shows the conditions that would be present after 44 shifts, providing a "2" at position 44 of the table of FIGURE 48. Finally, FIGURE 47 shows that forty-five successive shifts would provide the same result as was obtained before shifting (FIGURE 40). The same autocorrelation results are obtained (FIGURE 48) by this method as were obtained (FIGURE 33) by the more straight forward method outlined with respect to FIGURES 25–32. If input specimens of size $m$ by $n$ are to be identified, the input matrix must be of size $2m-1$ by $2n-1$ (or larger) to insure that no ambiquity is produced, regardless of the direction of the scanning of the pattern. As observable in FIGS. 40 through 47, if the scanning raster has less than five ($2m-1$, where $m=3$) elements, rows), the shifted pattern will overlap the unshifted pattern and provide false indications in some instances. For example, if the scanning raster contains four elements instead of five elements, the "2 shift" shown in FIG. 42 would erroneously provide an indication of an overlap at the lower-left corner of the unshifted specimen "3". Freedom from ambiguity is absolutely guaranteed when the number of dummy data elements (caused by scanning the document outside of the region containing the specimen) equals at least one less than the maximum number of data elements along a scan line in the region containing the specimen. Thus, a trivial array (all zeros) of data elements are located between each sequence of data elements that represent the specimen to insure unambiguous operation of the system.

Figure 39B:
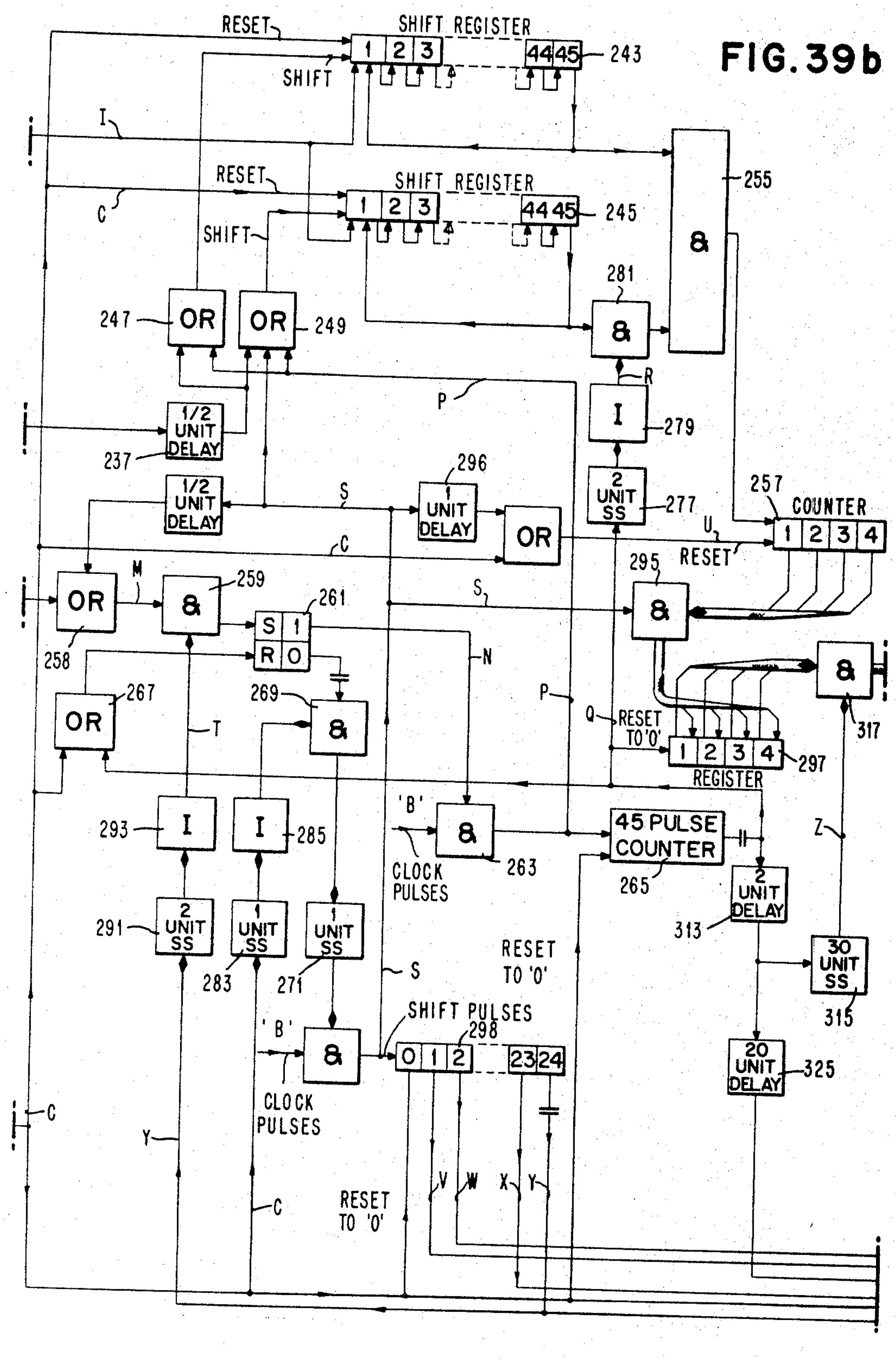
Figure 39C:
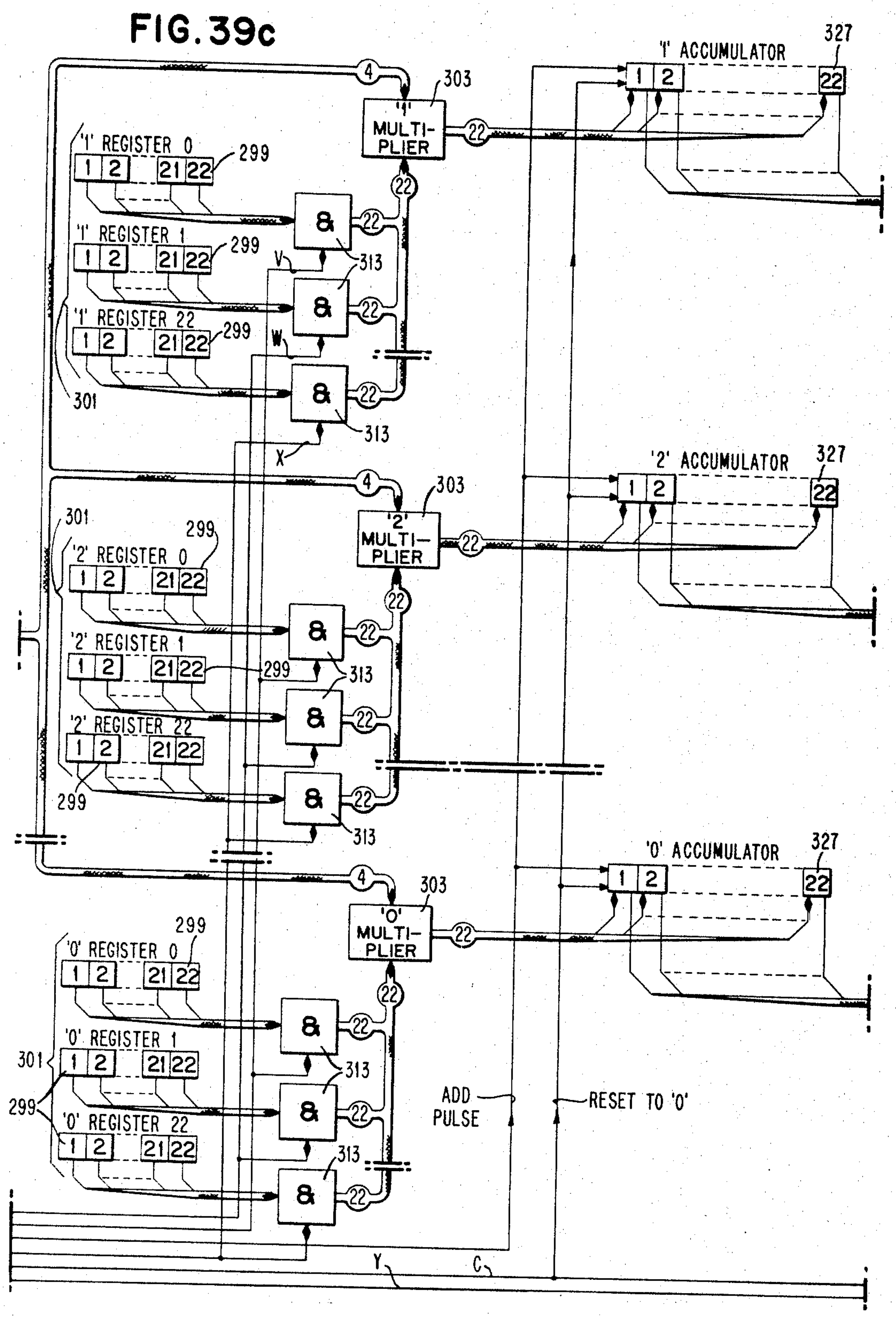

The operation of the shift registers and their associated circuitry to sequentially develop the 23 nonredundant sums is indicated in the tables in FIGURES 36–43. The sums are accumulated in counter 257 (FIGURE 39*b*). The counter 233 "readout at 45" is passed through "or" gate 258 (first pulse of waveshape M) and through "and" gate 259 to set flip-flop 261, which provides a conditioning signal (waveshape N) for "and" gate 263. The function of "and" gate 259 is explained below. The succeeding 45 clock pulses are passed through this "and" gate (waveshape P) and through "or" gates 247 and 249 to simultaneously shift each register 243 and 245 forty-five times. Since the output of the 45th position of storage is fed-back to the first position of storage in each shift register, each register returns to its initial condition after the 45 successive shifts. As the registers are shifted, an "and" gate 255 passes count pulses to counter 257 whenever the bits in the 45th order of the registers are "1's." Since identical video data is applied to both shift registers, the counter 257 records the sum of video bits during the first cycle of operations (as shown in FIGURE 40). The operation of two-unit single shot 277, inverter 279 and "and" gate 281 is explained below.

A 45-pulse counter 265 provides an output waveshape Q which is fed through "or" gate 267 to reset flip-flop 261, thus inhibiting the operation of "and" gate 263 after 45 pulses have passed. As flip-flop 261 is reset, a pulse is applied through "and" gate 269 one-unit single shot 271. The output of this single-shot conditions "and" gate 273 which passes the subsequent clock pulse. "And" gate 269 is inhibited for one unit of time after the occurrence of waveshape C through the action of one unit single shot 283 and inverter 285. This insures that no signal (waveshape S) will be generated when flip-flop 261 is initially reset (by waveshape C).

Waveshape S is applied through "or" gate 249 to shift the data in shift register 245 one position. This corresponds to shifting the pattern 201 on matrix 203 one unit as explained above. FIGURES 41–47 illustrate the operation of the shift registers during various data shifts. Waveshape S is also applied through a one-half unit delay 287, "or" gate 258, and "and" gate 259 to set flip-flop 261 for the second phase of operation (waveshape N). Delay 287 insures that the flip-flop 261 is not reset before register 245 is shifted. Thus, the registers 243 and 245 are shifted 45 times to cause a sum of coincidence of "1" signals to be accumulated in counter 257, then counter 245 is shifted one position, and each counter is again shifted 45 times. In this manner, the autocorrelation sums (FIGURE 48) are sequentially obtained.

Waveshape S also conditions "and" gate 295 to pass the accumulated total in counter 257 to the subsequent stages and after a delay of one unit in delay 296 resets counter 257 (waveshape U). This delay 296 insures that the counter 257 output will be passed to the subsequent stages before the counter is reset.

The output of the 45-pulse counter 265 (waveshape Q) initiates the operation of a two unit single shot 277 which provides a positive gate to inverter 279. The inverter output (waveshape R) inhibits the operation of "and" gate 281 during the time that shift register 245 is shifted one unit (by waveshape S). This prevents a possibly erroneous signal from being applied through "and" gate 255 to counter 257 during this shift.

A ring counter 298 provides timing for the subsequent circuits. This counter provides a "1" output on only one output lead at a time. The counter is set to its zero output by waveshape C. An output is developed from its first stage (waveshape V) after the first occurrence of waveshape S. Successive inputs step the counter through its 24 positions. Waveshape W is developed by the second input to the ring counter; waveshape X by the 23rd input; and waveshape Y by the 24th input. One of the functions of waveshape Y is to trigger 2-unit single-shot 291 which provides an output through inverter 293 to inhibit "and" gate 259 (waveshape T). This stops the automatic recycling of flip-flop 261 and shift registers 243 and 245 after 23 input character shifts have been completed.

The sums accumulated in counter 257 are passed through "and" gate 295 at the appropriate time to register 297. The number stored in this register is simultaneously multipled by multiplier 303 by a number stored in one read-only register 299 of each of the ten 23-register groups 301. The first number stored in register 297 is multiplied by the number stored in the "1" register-0 299 in "1" multiplier 303. This product is stored in the "1" accumulator 327. At the same time, "2" multiplier 303 multiplies the number stored in register 297 by the number stored in "2" register-0 299 and applies the product to the "2" accumulator 327. Simultaneously, the number stored in register 297 is multiplied by the number stored inthe appropriate register 299 and the products stored in the appropriate accumulator 327. The second number stored developed by counter 257, indicating the autocorrelation sum for a shift of one unit, is subsequently stored in register 297 and simultaneously multiplied by the number stored in "1" register-1, "2" register-1, etc., through "0" register-1. Ten multipliers are used in this embodiment; one for each of the characters to be identified. If serial multiplications were to be used, only one multiplier would be needed. Since 23 individual autocorrelation sums are computed when a 5 × 9 matrix is used; 23 registers 299 are used in each group 301. The numbers stored in registers 299 are indicated in the tables in FIGURE 34. Either the normalized autocorrelation function numbers or the normalized "second-difference" autocorrelation function numbers may be stored in registers 299. The appropriate numbers for storage in the registers are dependent upon the order of generation of sums in counter 257 by the circuit of FIGURE 39*a–b*. FIGURE 48 shows the autocorrelation function for the pattern "3" with its elements labelled "0," "1," "2," etc., through "44," indicating their order of generation. The number labelled "0" is placed in "3" register-0, the number labelled "1" is placed in "3" register-1, etc., through "22" which is placed in "3" register-22. All numbers must be doubled except the numbers placed in the "1" register-0, "2" register-0, etc., through "0" register-0 to account for the reflected numbers corresponding to 23, 24, 25, etc., through 44 shifts which are not developed by the circuit of FIGURE 39 as they are the same as the numbers developed by the first 22 shifts. The data in FIGURE 48 must be normalized for autocorrelation function comparison. When "second-difference" discrimination is used, the data must reflect this operator. "And" gates 313 are provided to select the appropriate registers 299. The ring counter 298 controls the timing of the operation of "and" gates 323, insuring that the numbers in the "1" register-0, "2" register-0, etc., are applied to the multipliers 303 after generation of the 0-shift autocorrelation sum; the numbers in the "1" register-1, "2" register-1, etc., are applied after generation of the 1-shift autocorrelation sum, etc., until finally, the numbers in the "1" register-22, "2" register-22, etc., are applied after the 22-shift (final) autocorrelation sum is obtained. Waveshape Q resets register 297 one unit of time before waveshape S conditions "and" gate 295 to pass the accumulated sum from counter 257 to the register. One unit of time later than waveshape S (due to the two unit delay 313 operating on waveshape Q), a 30-unit single shot 315 provides a conditioning level (waveshape Z) to "and" gate 317. The multiplier outputs are added to the associated accumulators 327 twenty units of time after "and" gate 317 is conditioned due to the action of delay 325. This delay provides time for the multipliers to develop their outputs. The twenty-fourth sum (caused by the twenty-third shift) accumulated in counter 257 is not used. Its development is automatic due to the use of a 24 level ring counter 298. This sum is disregarded because only 23 autocorrelations sums are needed with a 5×9 input matrix 203. This sum is passed by "and" gate 317 to the multiplier, but there are no registers to provide the second factor required for multiplication, so the product is zero and does not affect the sums in accumulators 327.

The maximum signal indicator circuits on FIGURES 40*d*, 40*e*, and 40*f* have two functions: first, to determine which accumulator 327 has the largest sum after the termination of the multiplications and second, to indicate whether the difference between the largest accumulated number and the next largest accumulated number is sufficiently great to indicate definite, unambiguous identification.

This determination is made on a ratio basis—a reject is indicated when the second-largest accumulated sum is within a preestablished percentage of the largest acculated sum. Ten minuend flip-flops 331 and nine subtrahend flip-flops 333 control ten minuend "and" gates 335, and nine subtrahend "and" gates 337 respectively. A subtractor 341 sequentially compares the numbers in the accumulators 327, under the control of the minuend and subtrahend "and" gates 335 and 337. During the first subtraction, the number stored in the "2" accumulator is subtracted from the number stored in the "1" accumulator. If the subtrahend is smaller than the minuend (providing a positive difference), the subtrahend is replaced by the number stored in the "3" accumulator. This is continued until a subtrahend larger than the minuend develops a negative difference from the subtrahend. If this occurs, the number in the subtrahend is placed in the minuend and the subtrahend contains the number stored in the next-higher-numbered accumulator. For example, if the "1" accumulator contains a number larger than the "2" accumulator, but smaller than the "3" accumulator, during the first subtraction the number in the "2" accumulator is subtracted from the number in the "1" accumulator, indicating a positive difference. The number in the "3" accumulator then becomes the subtrahend of a second subtraction from the number in the "1" accumulator. Since this subtraction provides a negative difference, the third subtraction uses the number in the "3" accumulator as the minuend and the number in the "4" accumulator as the subtrahend. This continues until the number in the "0" accumulator is the subtrahend of a subtraction from a number from one of the other accumulators. Since each subtraction that provides a negative remainder causes the subtrahend to become the minuend of the subsequent subtraction the number in the minuend (after all subtractions are completed) is the largest number in the accumulators 327.

Figure 39D:
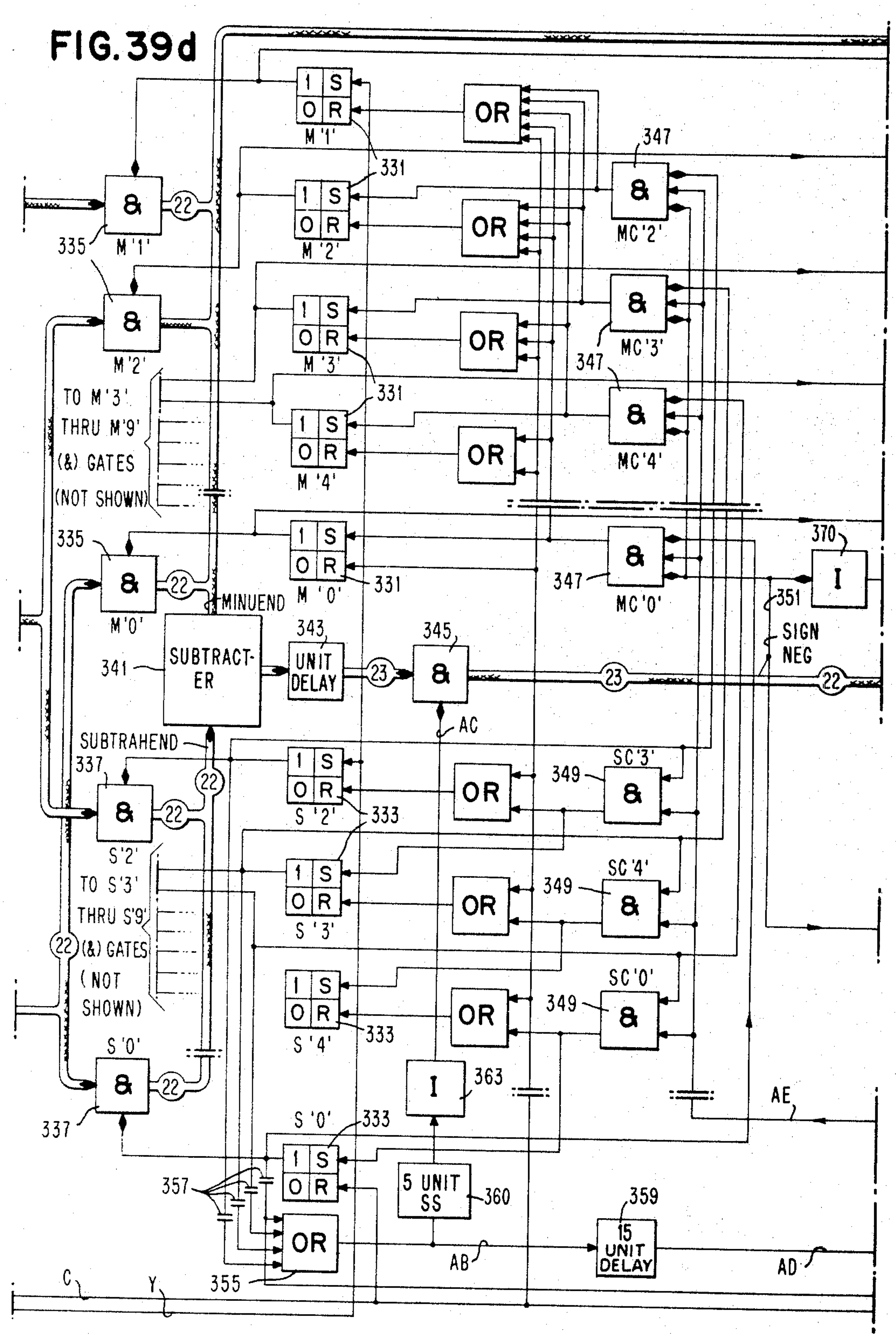

This procedure is accomplished in the circuitry of FIGURE 39*d* in the following manner. Waveshape Y from the 24th element of ring counter 298 sets the M "1" and S "2" flip-flops 331 and 333 which have outputs which condition the M "1" and S "2" "and" gates 335 and 337. These two "and" gates apply the number in the "1" accumulator 327 to the minuend input of subtracter 341 and the number in the "2" accumulator 327 to the subtrahend input of the subtracter. The subtracter output is applied through a one unit delay 343 and an "and" gate 345 to the subsequent circuits. The operation of the one unit delay and "and" gate will be explained below. Waveshape AE which is developed in the subsequent circuitry provides a pulse to the circuits of FIGURE 39 to indicate that the operations of the subsequent circuitry are completed and the next subtraction is to take place. The generation of waveshape AE will be explained below. The minuend and subtrahend of the next subtraction depends upon whether the result of the previous subtraction was positive or negative. The output of the S "2" flip-flop 333 is applied to the MC "2" (minuend control) "and" gate 347 and the SC "3" (subtrahend control) "and" gate 349. Waveshape AE is applied to all "and" gates 347 and "and" gates 349. The "sign-negative" lead 351 is applied to all "and" gates 347. The MC "2" "and" gate 347 is conditioned only when the difference of the previous subtraction is negative. Regardless of the sign of the difference of the previous subtraction, SC "3" "and" gate is conditioned. This output sets the S "3" flip-flop 333 and resets the S "2" flip-flop 333. This causes the subsequent subtraction to use the next subtrahend in order. If the difference of any subtraction is negative, in addition to substituting subtrahends, a new minuend is provided. The new minuend is the subtrahend of the previous subtraction, as explained above. In this case, the substitution of minuends is caused by the operation of the MC "1" "and" gate 347 when a negative sign is developed by the first subtraction. This operation continues as described above until the S "0" flip-flop 333 is set, causing the number in the "0" accumulator 327 to be used as a subtrahend of the subtraction. If this subtraction provides a positive difference indicating that the minuend is larger than the subtrahend, the minuend flip-flop 331 that is set during this subtraction provides an indication of the largest number in the accumulators 327. If the remainder of the last subtraction is negative, the S "0" flip-flop 333 output, the sign negative signal on lead 351 and waveshape AE cause the MC "0" "and" gate 347 to set minuend flip-flop M "0." Each minuend "and" gate 347 output in addition to setting the appropriate minuend flip-flop 331, provides a reset signal to all lower order minuend flip-flops 331. All minuend flip-flops 331 and subtrahend flip-flop 333 are initially reset to waveshape C. Each minuend flip-flop 331 provides a "1" output to one of "and" gates 353 as an indication of the accumulator 327 having the highest number stored (FIGURES 39*e* and 39*f*).

"Or" gate 355 (FIGURE 39*d*) has a pulse output (waveshape AB) as any subtrahend flip-flop 333 is set. The output of the subtrahend flip-flops is converted into a pulse by the operation of capacitors 357. This output is applied through a 15 unit delay 359 to the subsequent circuitry on FIGURE 39*e* and also to 5-unit single-shot 360. The output gate of this single-shot is applied through inverter 363 as waveshape AC to inhibit "and" gate 345. The 5-unit singel-shot and associated circuitry inhibits the subtracter output during the time that it is developing its output. One unit delay circuit 343 overcomes the effect of the inherent delays of "or" gate 355, 5-unit single-shot 360, and inverter 363, insuring that the subtracter output will be inhibited until completely developed.

Figure 39E:
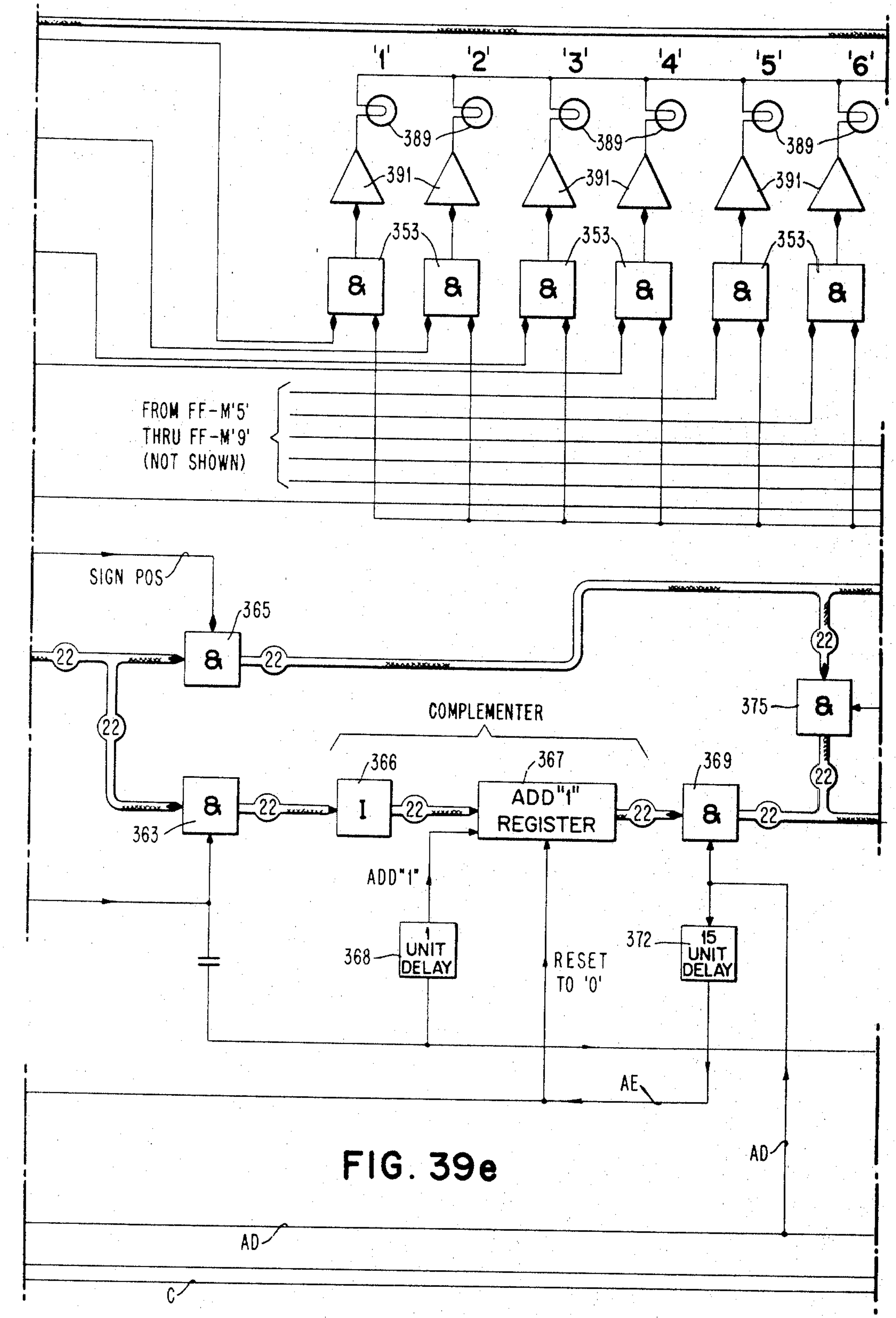
Figure 39F:
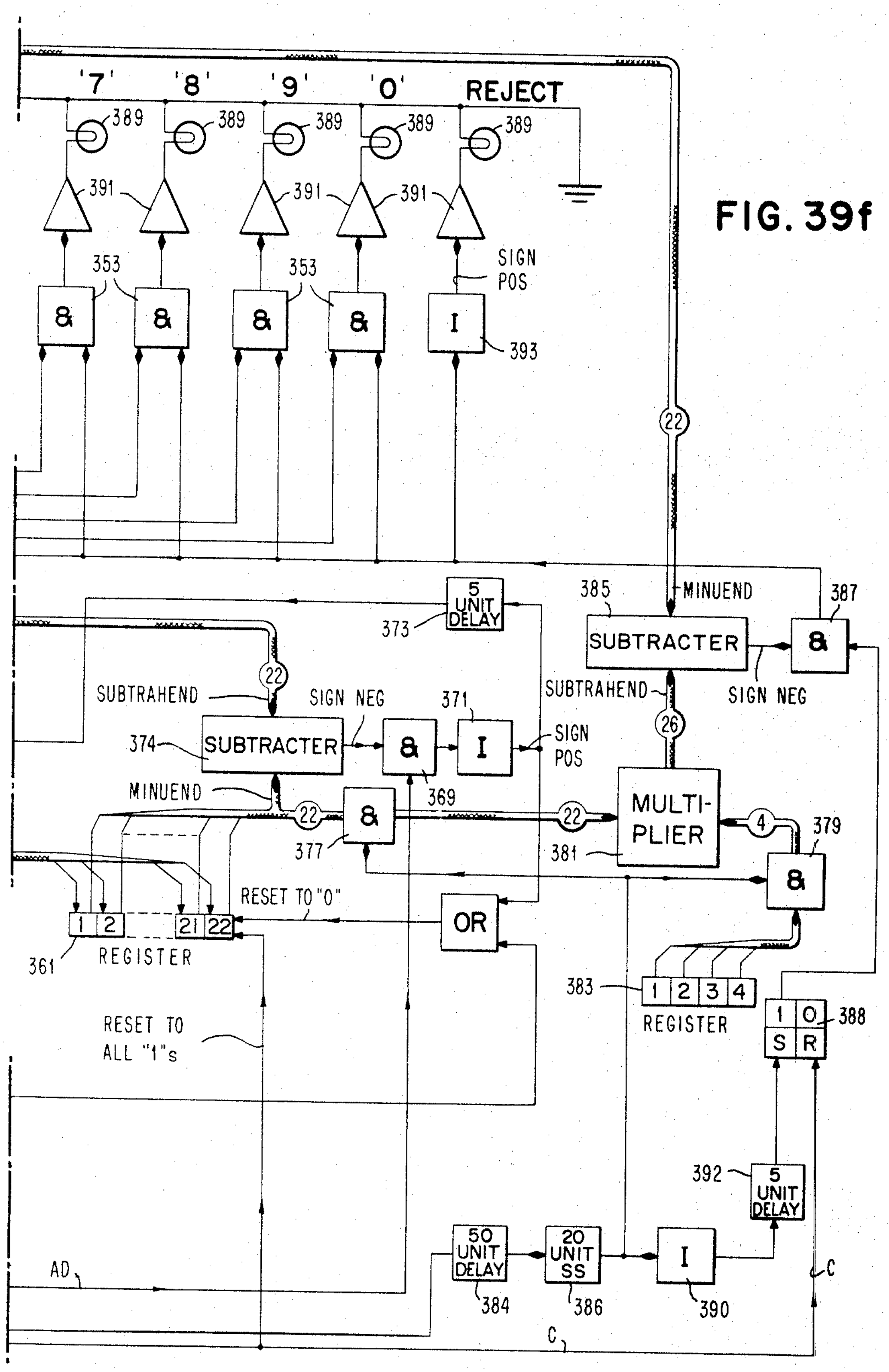

A comparison circuit, shown primarily on FIGURES 39*e* and 39*f*, detects the difference between the largest and second largest sums in accumulators 327 (FIGURE 39*c*), and indicates a reject if the ratio between these numbers is insufficient. As each subtraction is performed by subtracter 341, the difference obtained is compared to a difference obtained by previous subtraction and the smaller of these differences is stored for the subsequent comparisons to be made from subsequent subtractions. If the output of subtracter 341 is negative, indicating the subtrahend to be larger than the minuend, the comparison circuit stores the output of subtracter 341. No comparison is necessary in this case, as the smallest difference from the largest number used as a minuend by subtracter 341 up to the time that a negative difference is detected is always the difference between the minuend and subtrahend of the subtraction that caused the negative difference. If, however, the output of subtracter 341 is positive, it is necessary for the comparison circuit to store the difference of this subtraction only if this difference is smaller than any previous differences from the same minuend in subtracter 341. A register 361 (FIGURE 39*f*) is used as a storage element for the comparison circuit. If the output of subtracter 341 is negative, "and" gate 363 (FIGURE 39*e*) passes this output to a complementer comprised of a bank of inverters 366 (one for each bit of the twenty-two bit data) and an add "one" register 367. The complementer is necessary bectuse the output of subtracter 341 is in the complement form when negative. It is well known that to convert a number in the "2's" complement to the actual number, it is necessary to invert each bit and add one. The addition on "1" occurs one unit of time after the subtracters 341 output is passed through "and" gate 345 due to the operation of 1-unit delay 368. This delay provides sufficient time for the register 367 to accept its input from inverters 366. The output of the "add-1" register 367 is passed through "and" gate 369 to register 361 at the occurrence of waveshape AD which occurs 15 units of time after waveshape AB due to the operation of delay 369. This delay provides adequate time for the addition of "1" in register 367. Waveshape AE occurs 15 units of time after waveshape AD due to delay 372 and is used to reset register 367 and the previously discussed "and" gate 347 and 349 (FIGURE 39*d*). If the output of subtracter 341 is positive, "and" gate 365 (FIGURE 39*e*) is used to pass the subtracter output to the comparison circuit. "And" gate 365 requires a "sign-positive" input which is developed by inverter 370 (FIGURE 39*d*) from the "sign-negative" output of the subtracter. The output of "and" gate 365 is applied to a subtracter 374 where it is the subtrahend of the subtraction from the number previously stored in register 361. Waveshape C resets register 361 to all "1's" before it is used in the comparison circuits. The only output of subtracter 367 that is used is the sign bit. At the occurrence of waveshape AD, "and" gate 369 passes this output to inverter 371 which generates a "1" signal if the sign of the subtraction is positive. A positive sign at the output of inverter 371 indicates that the new difference obtained from subtracter 341 (FIGURE 39*d*) is smaller than the number stored in register 361 (FIGURE 39*f*). This output is delayed by five-unit delay 373 and applied to condition "and" gate 375 (FIGURE 39*e*). Delay 373 provides adequate time for register 361 to be reset to "0" before storing the new number. "And" gate 375 then passes the output of subtracter 341 to register 361. After all subtractions in subtracter 341 have been terminated, register 361 maintains the difference between the largest and second largest sums at accumulator 327. Then, the ratio between the largest and second largest sums is calculated and a determination made whether to accept the largest sum as an indication of the input specimen or to indicate a reject. Multiplier 381 develops the product of the number stored in register 361 and a constant stored in register 383. The multiplier inputs are applied for 20 units of time beginning 50 units of time after the S - "9" flip-flop 333 (FIGURE 39*e*) is set due to the action of delay 384 and single-shot 386. The delay provides adequate time for the last subtraction in subtracter 341 (FIGURE 39*e*) and stabilization of the comparison circuits on FIGURES 39*e* and 39*f*; the single-shot 386 provides sufficient time for multiplier 381 operation. The result of this multiplication is used as the subtrahend of the subtraction in subtracter 385 from the largest sum in accumulators 327. The only output of subtracter 385 that is used is the sign of the difference. If this sign is negative, indicating that the difference stored in register 361 is larger (after multiplication by the constant stored in register 383) than the largest sum in accumulators 327, no reject is indicated. The "sign-negative" output of subtracter 385 is passed by "and" gate 387 to "and" gates 353 to condition them, providing an indication of the input specimen by way of lighting one of a group of lamps 389. A flip-flop 388 provides the conditioning signal for "and" gate 387 while it is set. The flip-flop is set five units of time after the termination of the multiplier conditioning gate generated by single-shot 386 due to the action of an inverter 390 and a delay 392. The flip-flop is reset by waveshape C. Amplifiers 391 provide the required power to operate the lamps. If the output of subtracter 385 is positive indicating an insufficient difference between the largest and second largest sums in accumulators 327, the output of "and" gate 387 inhibits the operation of "and" gates 353. In this case, an inverter 393 (FIGURE 39*f*) provides a "1" output to operate a reject lamp 389.

The electronic device described above utilizes autocorrelation function comparisons to provide an output indicative of the specimen to be identified.

(9) *Summary*

Specimen identification using the principles of autocorrelation function comparison has been shown and described wherein the principles are illustrated in two optical embodiments and an electronic embodiment. In addition, specimen identification is shown to be enhanced by the use of functions of autocorrelation functions, rather than the functions themselves.

The specimen identification systems shown and described have many advantages including specimen registration invariance without loss of stability. The registration invariance advantage is especially valuable when the specimens to be identified are not accurately registered, such as might be expected when identifying handwritten specimens or specimens printed with a poor-quality typewriter.

The inventive technique of adding a trivial array (e.g., all zeros) between scan lines is shown. This technique enables the two-dimensional specimen to be converted into a one-dimensional array (as a function of time) without introducing errors and ambiguity into the system.

While the invention has been particularly shown and described with reference to preferred embodiments thereof, it will be understood by those skilled in the art that various changes in form and details may be made therein without departing from the spirit and scope of the invention.

What is claimed is:

1. Apparatus for converting an $n$-dimensional input array of data elements into an $m$-dimensional output array of data elements (where $m$ is less than $n$), comprising: means for generating an $m$-dimensional array where at least one dimension of the $m$ dimensions corresponds to at least two dimensions of the $n$-dimensions and is comprised of a sequence of $q$ one-dimensional arrays where $q$ is the size of a dimension of the input array; and means for placing a trivial one-dimensional array in between each of the plurality $q$ of arrays.

2. Apparatus for converting an $n$-dimensional input array of data elements into an $m$-dimensional output array of data elements, where $m$ is less than $n$, comprising: means for generating an $m$-dimensional array where at least one dimension of the $m$ dimensions corresponds to at least two dimensions of the $n$ dimensions and is comprised of a sequence of $q$ one-dimensional arrays of size $r$, where $q$ is the size of a dimension of the input array and where $r$ has a minimal size dependent upon the size of another dimension of the input array; and means for placing a trivial one-dimensional array in between each of the plurality $q$ of arrays.

3. Apparatus as described in claim 2, where the trivial one-dimensional array has a size of at least $r-1$.

4. Apparatus for converting a two-dimensional input array of data elements into a one-dimensional output array of data elements comprising: means for generating a one-dimensional array comprised of a plurality $q$ of one-dimensional arrays of size $r$ where $q$ and $r$ are the sizes of the dimensions of the input array; and means for placing a trivial one-dimensional array in between each of the plurality $q$ of arrays.

5. Apparatus as described in claim 4, where the trivial one-dimensional array has a size of at least $r-1$.

6. An apparatus for storing a two-dimensional input array of data elements consisting of $r$ one-dimensional portions, each of size $q$, in a one-dimensional shift circuit such that every combination of elements of the input array corresponds to a unique combination of elements in the shift circuit, comprising, in combination: means for applying the data elements in the input array to the input of the shift circuit, where each of the $q$ elements in each one-dimensional portion is applied in sequence and where each of the $r$ portions is applied in sequence; means for shifting the data in the shift circuit in a timed relationship with the application of data elements such that each data element is stored in a distinct position of the shift circuit; and means for spacing the data elements corresponding to each portion of the input array by at least $q-1$ positions in the shift circuit.

References Cited

UNITED STATES PATENTS

| | | | |
|---|---|---|---|
| 2,932,006 | 4/1960 | Glauberman | 340—146.3 |
| 3,025,495 | 3/1962 | Endres | 340—146.3 |

BERNARD KONICK, *Primary Examiner.*

J. F. BREIMAYER, *Assistant Examiner.*